(12) United States Patent
Kudoh et al.

(10) Patent No.: US 12,313,692 B2
(45) Date of Patent: May 27, 2025

(54) INFORMATION PROCESSING DEVICE, COMPUTER-READABLE RECORDING MEDIUM RECORDING A PROGRAM, AND INFORMATION PROCESSING METHOD

(71) Applicant: Panasonic Intellectual Property Corporation of America, Torrance, CA (US)

(72) Inventors: Takahiro Kudoh, Kyoto (JP); Eiichi Naito, Kyoto (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 166 days.

(21) Appl. No.: 18/090,796

(22) Filed: Dec. 29, 2022

(65) Prior Publication Data

US 2023/0134373 A1 May 4, 2023

Related U.S. Application Data

(63) Continuation of application No. PCT/JP2021/018565, filed on May 17, 2021.

(30) Foreign Application Priority Data

Jul. 29, 2020 (JP) .................................. 2020-128493

(51) Int. Cl.
*G01R 31/392* (2019.01)
*B60L 50/60* (2019.01)
(Continued)

(52) U.S. Cl.
CPC ............ *G01R 31/392* (2019.01); *B60L 50/60* (2019.02); *B60L 58/16* (2019.02); *G01R 31/374* (2019.01);
(Continued)

(58) Field of Classification Search
CPC ..... G01R 31/374; G01R 31/382; G01R 31/392
See application file for complete search history.

(56) References Cited

U.S. PATENT DOCUMENTS

| | | | | |
|---|---|---|---|---|
| 2010/0007481 A1* | 1/2010 | Uchida | ................... | B60L 53/65 340/455 |
| 2016/0377686 A1* | 12/2016 | Uchida | .............. | G01R 31/3842 702/63 |

(Continued)

FOREIGN PATENT DOCUMENTS

| | | |
|---|---|---|
| JP | 2003-297435 | 10/2003 |
| JP | 2007-323999 | 12/2007 |

(Continued)

OTHER PUBLICATIONS

International Search Report (ISR) from International Searching Authority (Japan Patent Office) in International Pat. Appl. No. PCT/JP2021/018565, dated Jul. 27, 2021, together with an English language translation.

(Continued)

*Primary Examiner* — Noam Reisner
(74) *Attorney, Agent, or Firm* — Greenblum & Bernstein, P.L.C.

(57) ABSTRACT

An information processing device includes: a state information acquisition unit that acquires state information representing a state of a battery mounted on an electric device driven by the battery; an association information acquisition unit that acquires association information representing an association between the state of the battery and a deterioration rate of the battery; a deterioration information deriving unit that derives deterioration information related to the deterioration rate of the battery, based on the state information and the association information; and an output unit that outputs the deterioration information.

18 Claims, 18 Drawing Sheets

(51) Int. Cl.
  *B60L 58/16*    (2019.01)
  *G01R 31/374*   (2019.01)
  *G01R 31/382*   (2019.01)
  *H01M 10/42*    (2006.01)
  *H01M 10/48*    (2006.01)

(52) U.S. Cl.
  CPC .......... *G01R 31/382* (2019.01); *H01M 10/48* (2013.01); *H01M 2010/4278* (2013.01)

(56) References Cited

U.S. PATENT DOCUMENTS

| | | |
|---|---|---|
| 2017/0003352 A1 | 1/2017  | Barre et al. |
| 2017/0294689 A1 | 10/2017 | Wada et al. |
| 2019/0033377 A1 | 1/2019  | Karner et al. |
| 2019/0033381 A1 | 1/2019  | Karner et al. |
| 2019/0033382 A1 | 1/2019  | Karner et al. |
| 2019/0033383 A1 | 1/2019  | Karner et al. |
| 2019/0033384 A1 | 1/2019  | Karner et al. |
| 2019/0033385 A1 | 1/2019  | Karner et al. |
| 2019/0033388 A1 | 1/2019  | Karner et al. |
| 2019/0033393 A1 | 1/2019  | Karner et al. |
| 2019/0033394 A1 | 1/2019  | Karner et al. |
| 2019/0033395 A1 | 1/2019  | Karner et al. |
| 2019/0033396 A1 | 1/2019  | Karner et al. |
| 2019/0033397 A1 | 1/2019  | Karner et al. |
| 2019/0035237 A1 | 1/2019  | Karner et al. |
| 2019/0036178 A1 | 1/2019  | Karner et al. |
| 2021/0048482 A1 | 2/2021  | Ukumori |
| 2022/0404426 A1 | 12/2022 | Karner et al. |

FOREIGN PATENT DOCUMENTS

| | | |
|---|---|---|
| JP | 2017-509103 | 3/2017 |
| JP | 2019-168451 | 10/2019 |

OTHER PUBLICATIONS

Extended European Search Report (EESR) from European Patent Office (EPO) in European Patent Appl. No. 21848870.8, dated Nov. 9, 2023.

European Office Action from European Patent Office (EPO) in European Patent Appl. No. 21848870.8, dated Feb. 17, 2025.

* cited by examiner

INFORMATION PROCESSING DEVICE, COMPUTER-READABLE RECORDING MEDIUM RECORDING A PROGRAM, AND INFORMATION PROCESSING METHOD

TECHNICAL FIELD

The present disclosure relates to an information processing device, a computer-readable recording medium recording a program, and an information processing method.

BACKGROUND ART

Patent Literature 1 below discloses a technique for estimating a deterioration state of a battery mounted on an electric vehicle.

With the technique disclosed in Patent Literature 1, a deterioration state of a battery such as a state of health (SOH) can be presented to a user. However, because the SOH is merely information as a result of deterioration of the battery, the user cannot easily understand, on the basis of the SOH, how the user's own way of driving directly affects the deterioration of the battery.

CITATION LIST

Patent Literature

Patent Literature 1: JP 2017-509103 A

SUMMARY OF INVENTION

An object of the present disclosure is to provide a technique capable of presenting, to a user, deterioration information related to a rate of progress of deterioration (deterioration rate) of a battery mounted on an electric device.

An information processing device according to one aspect of the present disclosure includes: a state information acquisition unit that acquires state information representing a state of a battery mounted on an electric device driven by the battery; an association information acquisition unit that acquires association information representing an association between the state of the battery and a deterioration rate of the battery; a deterioration information deriving unit that derives deterioration information related to the deterioration rate of the battery, based on the state information and the association information; and an output unit that outputs the deterioration information.

DESCRIPTION OF EMBODIMENTS

Knowledge Underlying Present Disclosure

Figure 1:
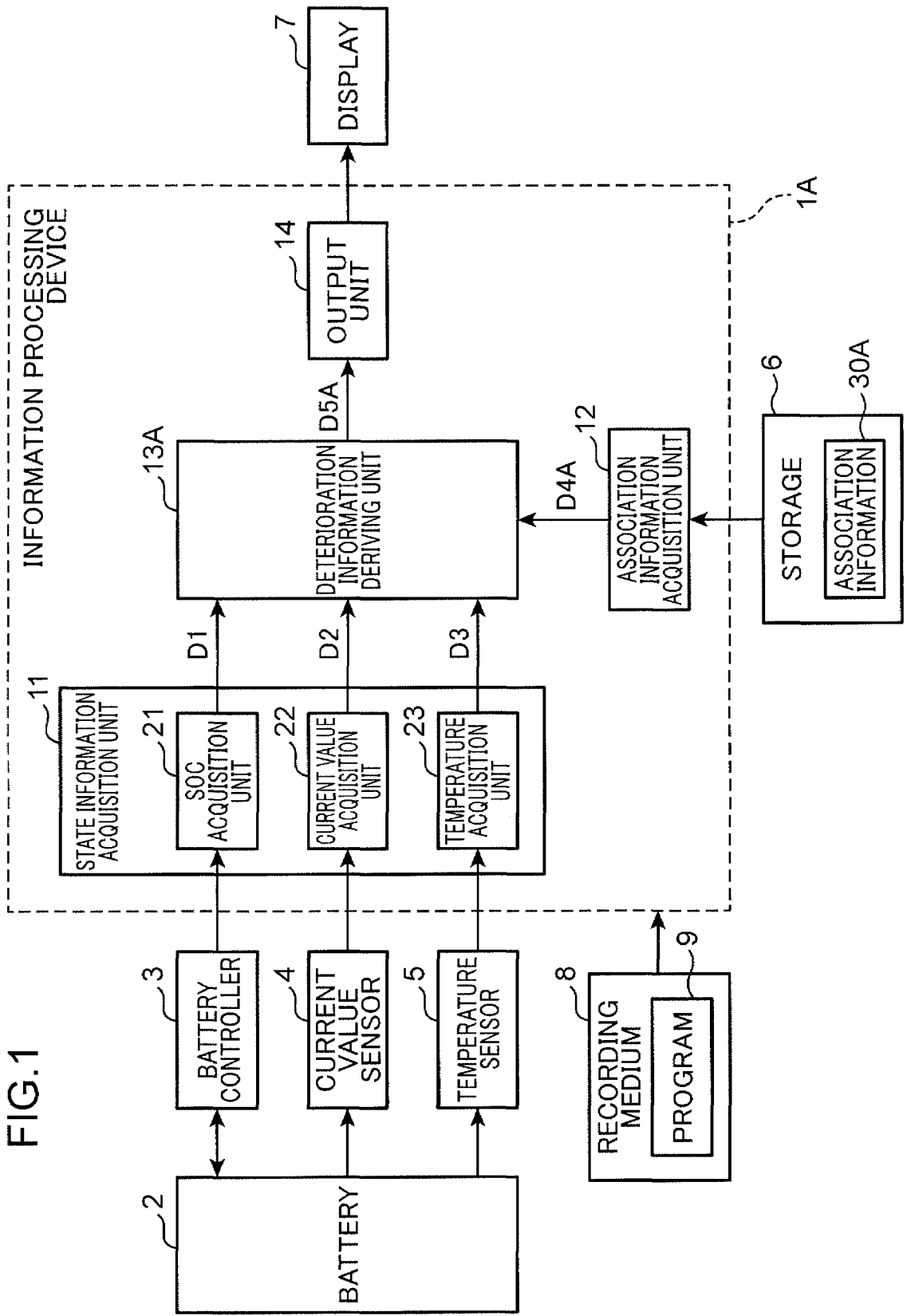
FIG. 1 is a block diagram illustrating a configuration of an information processing device according to a first embodiment of the present disclosure.

Electric vehicles equipped with a travel motor driven by a battery are becoming widespread. The battery deteriorates in accordance with a total travel distance of a vehicle. As an index representing a deterioration state of a battery, an SOH is generally used. A vehicle in which the SOH of the battery is displayed on a display visible to the driver also has been put into practical use.

Patent Literature 1 discloses a device that estimates a deterioration state (SOH or the like) of a battery mounted on an electric vehicle. The device acquires time-series data related to a speed of a vehicle, extracts a section from the time-series data, the section satisfying a predetermined condition, and applies a predetermined estimation model to the section, thereby estimating the deterioration state of the above battery.

However, because the SOH is merely information as a result of deterioration of the battery, the user cannot easily understand, on the basis of the SOH, how the user's own way of driving directly affects the deterioration of the battery.

In order to solve the above problems, the present inventor has obtained the following knowledge and has conceived the present disclosure. By presenting, instead of the SOH as a result of the deterioration of the battery, information related to a rate of progress of deterioration (deterioration rate) of the battery to a user, it is possible to increase the user's awareness about the deterioration of the battery, and as a result, the user's way of driving is improved, so that a suppressing effect on the deterioration of the battery can be expected.

Next, each aspect of the present disclosure will be described.

An information processing device according to one aspect of the present disclosure includes: a state information acquisition unit that acquires state information representing a state of a battery mounted on an electric device driven by the battery; an association information acquisition unit that acquires association information representing an association between the state of the battery and a deterioration rate of the battery; a deterioration information deriving unit that derives deterioration information related to the deterioration rate of the battery, based on the state information and the association information; and an output unit that outputs the deterioration information.

According to this configuration, the state information acquisition unit acquires the state information representing the state of the battery, and the association information acquisition unit acquires the association information representing the association between the state of the battery and the deterioration rate of the battery. Then, the deterioration information deriving unit derives the deterioration information related to the deterioration rate of the battery, based on the state information acquired by the state information acquisition unit and the association information acquired by the association information acquisition unit. By the output unit outputting the deterioration information, it is possible to present, to the user, the deterioration information related to the deterioration rate of the battery mounted on the electric device. By presenting, to the user, the deterioration information related to the deterioration rate of the battery, a user's awareness about the deterioration of the battery can be improved, and as a result, the way of using the electric device is improved, so that a suppressing effect on the deterioration of the battery can be expected.

In the above aspect, the state of the battery includes at least one of a temperature of the battery and a current value of the battery.

With this configuration, accuracy of the deterioration information can be improved by using the state information representing at least one of the temperature of the battery and the current value of the battery.

In the above aspect, the state of the battery further includes a remaining capacity of the battery.

With this configuration, the accuracy of the deterioration information can be further improved by using the state information further representing the remaining capacity of the battery.

In the above aspect, the deterioration information deriving unit derives, as the deterioration information, information representing the deterioration rate of the battery.

This configuration makes it possible to present, to the user, the information representing the deterioration rate of the battery.

In the above aspect, the deterioration information deriving unit derives, as the deterioration information, information on a main cause that causes the deterioration of the battery.

This configuration makes it possible to present, to the user, the information on the main cause that causes the deterioration of the battery.

In the above aspect, the information processing device further includes a deterioration degree information acquisition unit that acquires deterioration degree information representing a deterioration degree of the battery, wherein the deterioration information deriving unit derives, as the deterioration information, a first remaining life that is a remaining life of the battery corresponding to the deterioration rate, based on the state information, the association information, and the deterioration degree information.

This configuration makes it possible to present, to the user, the first remaining life that is the remaining life of the battery corresponding to the deterioration rate.

In the above aspect, the deterioration information deriving unit further derives, as the deterioration information, a remaining life difference between the first remaining life and a second remaining life, and the second remaining life is a remaining life of the battery corresponding to the deterioration degree under a previously set standard use condition.

This configuration makes it possible to present, to the user, the remaining life difference between the first remaining life and the second remaining life.

In the above aspect, the information processing device further includes an atmospheric temperature information acquisition unit that acquires atmospheric temperature information representing a predicted atmospheric temperature at a current location, wherein the deterioration information deriving unit derives, as the deterioration information, a preferable storage condition of the electric device, based on the state information, the association information, and the atmospheric temperature information.

This configuration makes it possible to present, to the user, the preferable storage condition of the electric device corresponding to the predicted atmospheric temperature at the current location.

A computer-readable recording medium recording a program according to one aspect of the present disclosure causes an information processing device to function as: state information acquisition means that acquires state information representing a state of a battery mounted on an electric device driven by the battery; association information acquisition means that acquires association information representing an association between the state of the battery and a deterioration rate of the battery; deterioration information deriving means that derives deterioration information related to the deterioration rate of the battery, based on the state information and the association information; and output means that outputs the deterioration information.

According to this configuration, the state information acquisition means acquires the state information representing the state of the battery, and the association information acquisition means acquires the association information representing the association between the state of the battery and the deterioration rate of the battery. Then, the deterioration information deriving means derives the deterioration information related to the deterioration rate of the battery, based on the state information acquired by the state information acquisition means and the association information acquired by the association information acquisition means. By the output means outputting the deterioration information, it is possible to present, to the user, the deterioration information related to the deterioration rate of the battery mounted on the electric device. By presenting, to the user, the deterioration information related to the deterioration rate of the battery, a user's awareness about the deterioration of the battery can be improved, and as a result, the way of using the electric device is improved, so that a suppressing effect on the deterioration of the battery can be expected.

An information processing method according to one aspect of the present disclosure includes, by an information processing device: acquiring state information representing a state of a battery mounted on an electric device driven by the battery; acquiring association information representing an association between the state of the battery and a deterioration rate of the battery; deriving deterioration information related to the deterioration rate of the battery, based on the state information and the association information; and outputting the deterioration information.

According to this configuration, the information processing device acquires state information representing a state of a battery, acquires association information representing an association between the state of the battery and a deterioration rate of the battery, and derives deterioration information related to the deterioration rate of the battery, based on the acquired state information and the acquired association information. By outputting the deterioration information, it is possible to present, to the user, the deterioration information related to the deterioration rate of the battery mounted on the electric device. By presenting, to the user, the deterioration information related to the deterioration rate of the battery, a user's awareness about the deterioration of the battery can be improved, and as a result, the way of using the electric device is improved, so that a suppressing effect on the deterioration of the battery can be expected.

The comprehensive or specific aspects of the present disclosure described above can be implemented as a system, a device, a method, an integrated circuit, a computer program, or any combination thereof. Furthermore, it goes without saying that such a computer program can be distributed as a computer-readable non-volatile recording medium such as a compact disc read only memory (CD-ROM), or can be distributed via a communication network such as the Internet.

Each of the embodiments described below illustrates a specific example of the present disclosure. Numerical values, shapes, components, steps, order of steps, and the like shown in the following embodiments are merely examples, and are not intended to limit the present disclosure. The components that are included in the following embodiment but are not described in the independent claims representing the highest concepts are described as arbitrary components. In all the embodiments, respective contents can be combined.

Hereinafter, embodiments of the present disclosure will be described in detail with reference to the drawings. Note that elements denoted by the same reference signs in different drawings represent the same or corresponding elements.

First Embodiment

FIG. 1 is a block diagram illustrating a configuration of an information processing device 1A according to a first embodiment of the present disclosure. In the example of the present embodiment, the information processing device 1A is mounted on an electric vehicle as an example of the electric device. However, other than electric vehicles, the information processing device 1A may be mounted on any electric device (for example, a vehicle such as an electric motorcycle or an electronic device such as a smartphone) driven by a battery.

The electric vehicle includes a travel motor (not illustrated) for traveling and a battery 2 for supplying electric power to the travel motor. The battery 2 is a secondary battery such as a lithium ion battery. The electric vehicle includes a battery controller 3, a current value sensor 4, a temperature sensor 5, a storage 6, and a display 7. The battery controller 3 performs charge and discharge control and state management of the battery 2. The current value sensor 4 measures a current value of a charge or discharge current (at least a discharge current) of the battery 2. The temperature sensor 5 measures the temperature of the battery 2. The storage 6 is a flash memory or the like. The storage 6 stores association information 30A to be described later. The display 7 is a liquid crystal display, an organic EL display, or the like. The display 7 is disposed at a position, such as an instrument panel in front of the driver's seat of the electric vehicle, at which position a driver of the electric vehicle can visually recognize the display 7 when seated.

The information processing device 1A includes a state information acquisition unit 11, an association information acquisition unit 12, a deterioration information deriving unit 13A, and an output unit 14. The state information acquisition unit 11 includes a state of charge (SOC) acquisition unit 21, a current value acquisition unit 22, and a temperature acquisition unit 23. These functions included in the information processing device 1A may be performed by software on a signal processing unit such as a central processing unit (CPU) reading and executing a computer program 9 stored in a nonvolatile recording medium 8 such as a read-only memory (ROM), or may be realized as hardware using a dedicated circuit such as a field programmable gate array (FPGA).

The state information acquisition unit 11 acquires state information representing a state of the battery 2. Specifically, the SOC acquisition unit 21 acquires information representing a remaining capacity (SOC) of the battery 2 from the battery controller 3, and inputs the information to the deterioration information deriving unit 13A as data D1. The current value acquisition unit 22 acquires information representing the current value of a charge or discharge current of the battery 2 from the current value sensor 4, and inputs the information to the deterioration information deriving unit 13A as data D2. The temperature acquisition unit 23 acquires information representing a temperature of the battery 2 from the temperature sensor 5, and inputs the information to the deterioration information deriving unit 13A as data D3.

The association information acquisition unit 12 acquires the association information 30A by reading out data from the storage 6, and inputs the association information 30A to the deterioration information deriving unit 13A as data D4A. The association information acquisition unit 12 may acquire the association information 30A by receiving data from a cloud server outside the electric vehicle by wireless communication instead of reading out data from the storage 6.

The association information 30A is information representing the relationship between the state of the battery 2 (SOC, current value, and temperature) and the deterioration rate of the battery 2. The deterioration rate represents an amount of change in the deterioration degree of the battery 2 per unit time or unit travel distance. In the present embodiment, the deterioration rate of the battery 2 is denoted as "$\Delta SOH$" using SOH, which is a general index representing the deterioration degree of the battery.

In a first example, the association information 30A is obtained as a learned model by machine learning. In a learning phase, the data of the SOC, the current value, and the temperature of the battery 2 with correct labels of the $\Delta SOH$ are used as teacher data to construct a learning model, whereby a learned model representing the relationship between the $\Delta SOH$ and each of the SOC, the current value, and the temperature of the battery 2 is output. As the learned model, the association information 30A is obtained. Then, in a use phase, the information processing device 1A inputs, to the learned model, data of the SOC, the current value, and the temperature of the battery 2 as input information, whereby the $\Delta SOH$ is output after internal processing of the above learned model. Note that the machine learning algorithm is not particularly limited as long as the above output result can be achieved, and for example, a regression algorithm such as multiple regression analysis or a neural network can be used.

Figure 2:
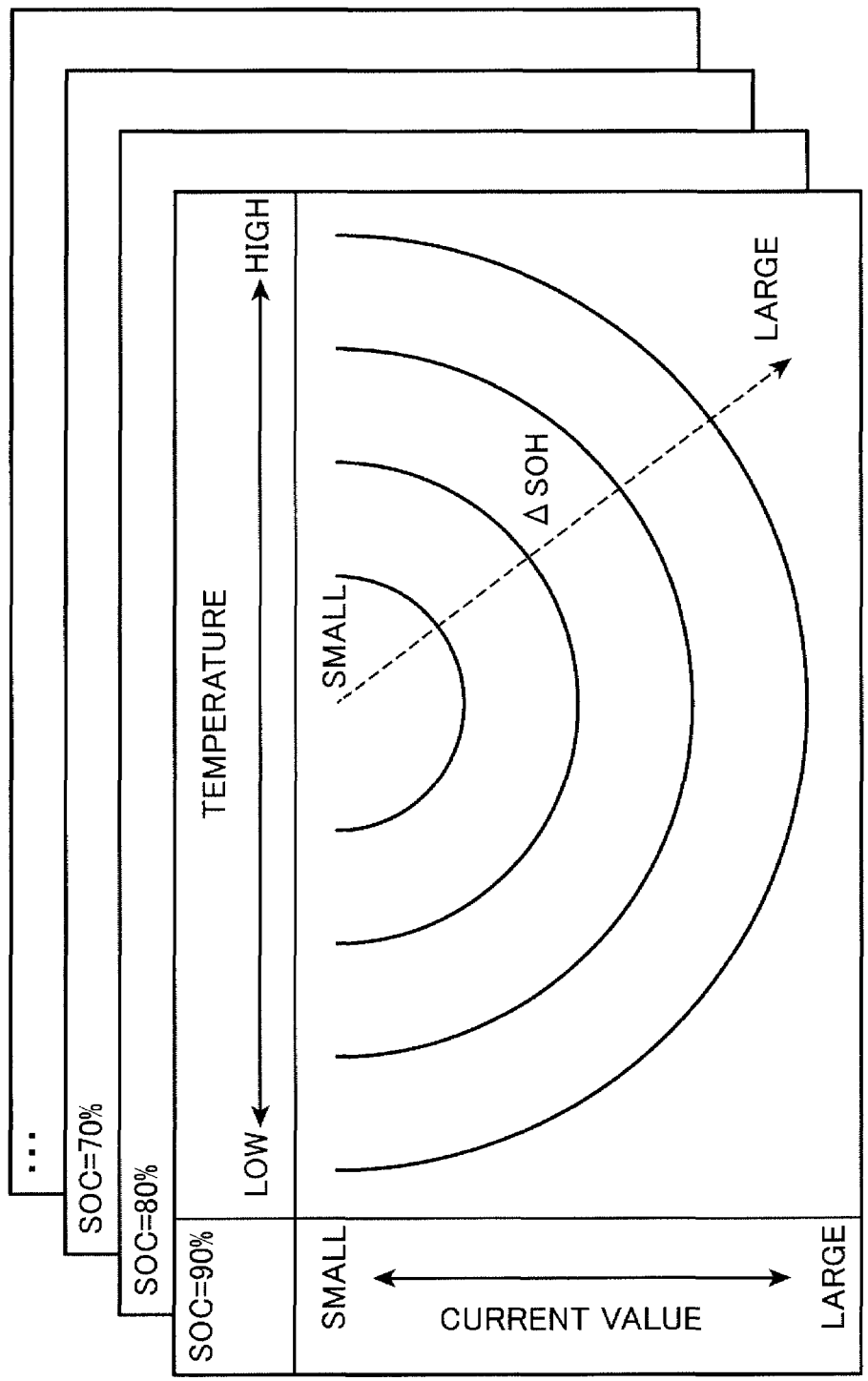
FIG. 2 is a diagram illustrating, in a simplified manner, an example of a three-dimensional data map.

In a second example, the association information 30A is obtained as a three-dimensional data map having the SOC, on which data map the SOC, the current value, and the temperature of the battery 2 are input data, and the ΔSOH is output data. FIG. 2 is a diagram illustrating, in a simplified manner, an example of the three-dimensional data map. The three-dimensional data maps are constructed in the following manner. Two-dimensional data maps having the temperature and the current value as input data and having the ΔSOH as output data are each created at predetermined intervals of the SOC (10% interval in this example) On each of the two-dimensional data maps, the ΔSOH is at its minimum when the temperature of the battery 2 is appropriate and the current value is at its minimum, and the ΔSOH increases as the temperature of the battery 2 deviates from the appropriate temperature or as the current value of the battery 2 increases. When the temperature and the current value are the same condition, ΔSOH decreases as the SOC decreases. With respect to the SOC having a value for which the two-dimensional data map is not prepared, it is possible to obtain the ΔSOH by interpolation calculation using the two two-dimensional data maps sandwiching the value of the SOC.

In the above first and second examples, the state of the battery 2 only has to include at least one of the current value and the temperature; however, to improve the accuracy of the ΔSOH, it is preferable to include both the current value and the temperature. Preferably, as described in the above first and second examples, the SOC, the current value, and the temperature are all included.

With reference to FIG. 1, by referring to the association information 30A (the learned model or the three-dimensional data map described above) indicated by the data D4A, the deterioration information deriving unit 13A derives the deterioration information (ΔSOH itself in the present embodiment) related to the deterioration rate of the battery 2 corresponding to the state information (SOC, current value, and temperature) of the battery 2 represented by the data D1 to D3. The deterioration information deriving unit 13A inputs data D5A representing the derived ΔSOH to the output unit 14, and the output unit 14 outputs the data D5A. The data D5A output from the output unit 14 is input to the display 7.

Figure 3:
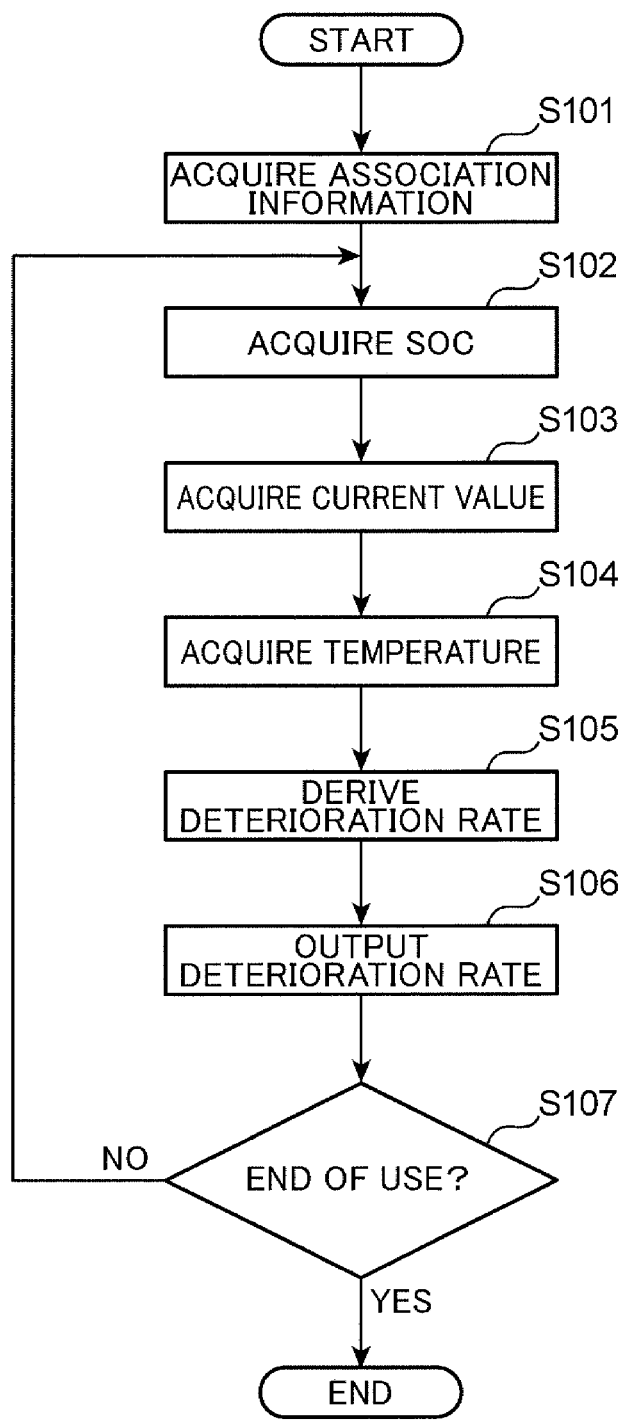
FIG. 3 is a flowchart illustrating a flow of a process performed by the information processing device.

FIG. 3 is a flowchart illustrating a flow of a process performed by the information processing device 1A. When a power source of the electric vehicle is turned on and the information processing device 1A is thereby activated, the process starts to be performed.

First, in step S101, the association information acquisition unit 12 acquires the association information 30A from the storage 6, and inputs the association information 30A to the deterioration information deriving unit 13A.

Next, in step S102, the SOC acquisition unit 21 acquires the information representing the SOC of the battery 2 from the battery controller 3, and inputs the information to the deterioration information deriving unit 13A.

Next, in step S103, the current value acquisition unit 22 acquires information representing the current value of the charge or discharge current of the battery 2 from the current value sensor 4, and inputs the information to the deterioration information deriving unit 13A.

Next, in step S104, the temperature acquisition unit 23 acquires information representing the temperature of the battery 2 from the temperature sensor 5, and inputs the information to the deterioration information deriving unit 13A.

Next, in step S105, the deterioration information deriving unit 13A refers to the association information 30A input in step S101 to derive the ΔSOH of the battery 2 corresponding to the SOC, the current value, and the temperature of the battery 2 input in steps S102 to S104.

Next, in step S106, the output unit 14 outputs data D5A representing the ΔSOH derived in step S105. The data D5A output from the output unit 14 is input to the display 7.

Next, in step S107, on the basis of whether the power source of the electric vehicle is turned off, the information processing device 1A determines if the use of the electric vehicle is ended.

If the use of the electric vehicle is not ended (step S107: NO), the information processing device 1A repeatedly performs the process of steps S102 to S107 at predetermined intervals (for example, at one second intervals).

If the use of the electric vehicle is ended (step S107: YES), the information processing device 1A ends the process.

Figure 4:
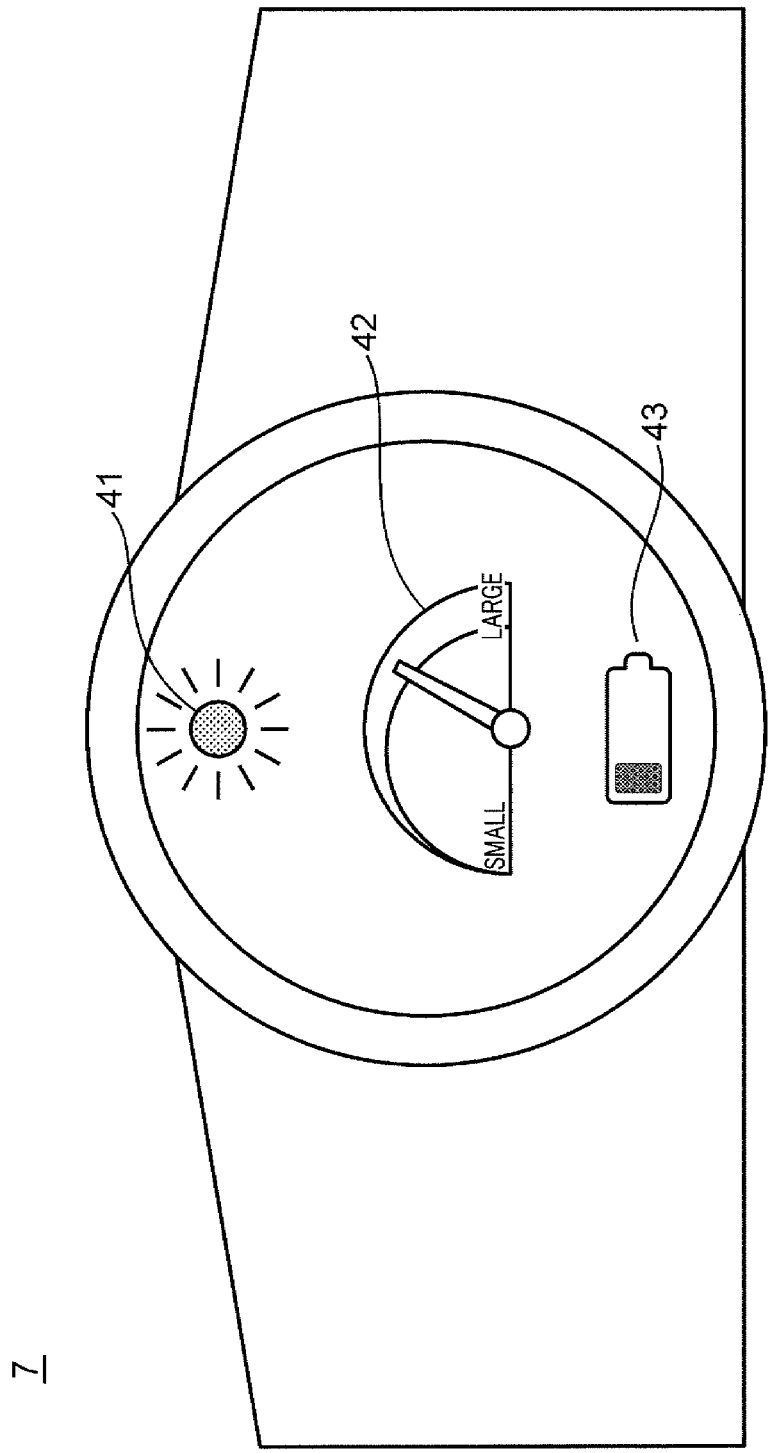
FIG. 4 is a diagram illustrating a display example of a ΔSOH on a display.

FIG. 4 is a diagram illustrating a display example of the ΔSOH on the display 7. A graphic 41 imitating a warning light is turned on when the ΔSOH is equal to or larger than a predetermined threshold value, and is turned off when the ΔSOH is smaller than the threshold value. In a graphic 42 imitating a speed meter, the needle rotationally moves further rightward as the value of ΔSOH is larger, and the needle rotationally moved further leftward as the value of ΔSOH is smaller. A graphic 43 imitating a battery shape indicates the SOC. Note that the SOH may be displayed in addition to the SOC. Further, the display position does not have to be on the instrument panel in front of the driver's seat, and may be on a display screen included in a previously registered mobile terminal (such as a smartphone of the user). In this manner, the present ΔSOH of the battery 2 can be presented to the user in the form of information display on the display 7. Note that the form of presentation is not limited to display, and may be audio output from a speaker, or may be vibration generated on a pedal or the steering wheel of the electric vehicle, or the like.

According to the present embodiment, the state information acquisition unit 11 acquires the state information representing the state of the battery 2, and the association information acquisition unit 12 acquires the association information 30A representing the relationship between the states of the battery 2 and the deterioration rate. Then, the deterioration information deriving unit 13A derives the deterioration information related to the ΔSOH of the battery 2, based on the state information acquired by the state information acquisition unit 11 and the association information acquired by the association information acquisition unit 12. By the output unit 14 outputting the deterioration information, it is possible to present, to the user, the deterioration information related to the ΔSOH of the battery 2 mounted on the electric device such as an electric vehicle. By presenting, to the user, the deterioration information related to the ΔSOH of the battery 2, the user's awareness about the deterioration of the battery 2 can be improved, and as a result, the way of driving is improved, so that a suppressing effect on the deterioration of the battery 2 can be expected.

With the present embodiment, the accuracy of the ΔSOH can be improved by using the state information representing at least one of the temperature and the current value of the battery 2.

In addition, with the present embodiment, the accuracy of ΔSOH can be further improved by using the state information further representing the SOC of the battery 2.

In addition, with the present embodiment, the deterioration information deriving unit 13A derives, as the deterioration information, the information representing the ΔSOH of the battery 2, whereby it is possible to present, to the user, the information representing the ΔSOH of the battery 2.

Second Embodiment

Figure 5:
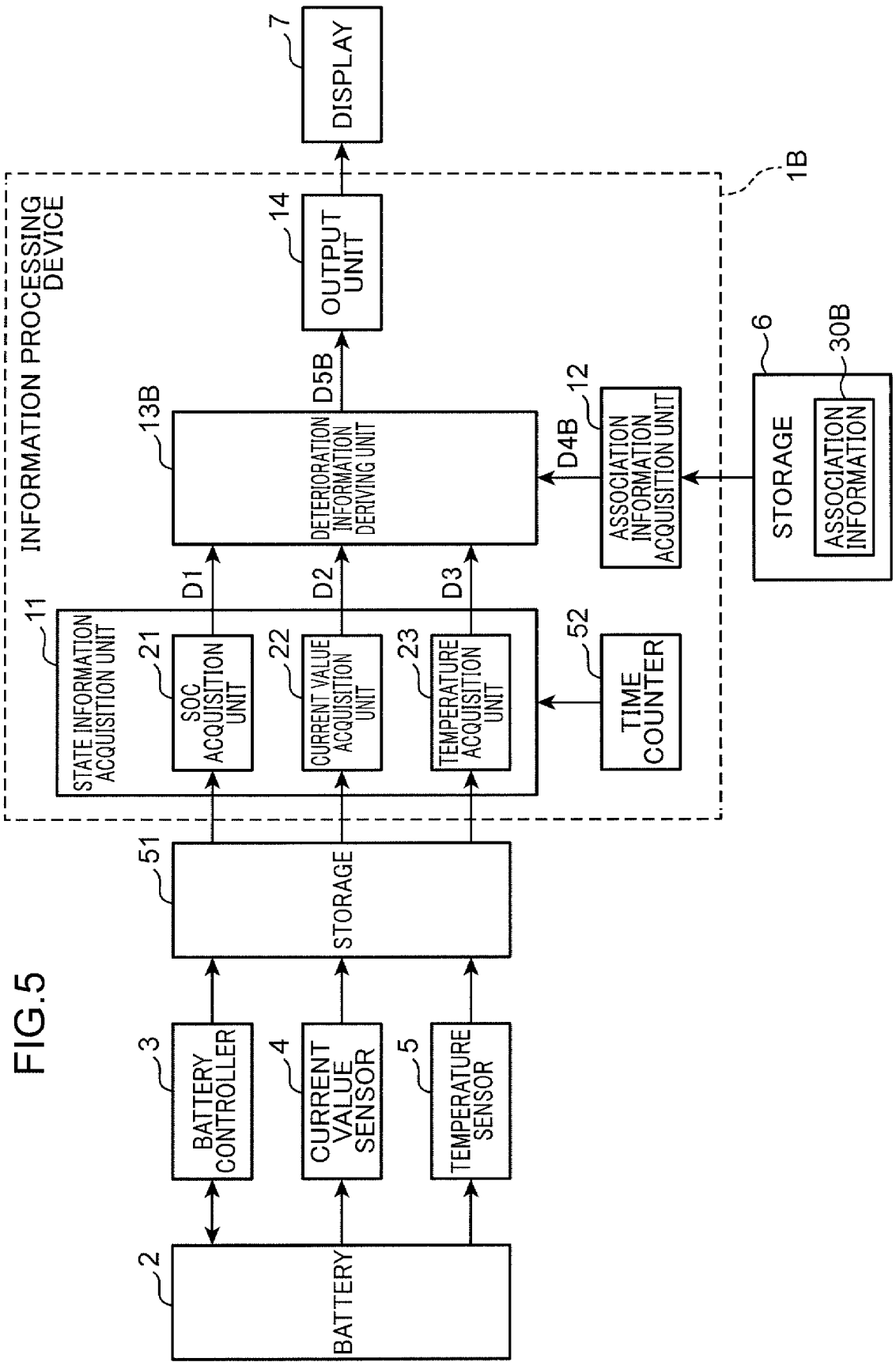
FIG. 5 is a block diagram illustrating a configuration of an information processing device according to a second embodiment of the present disclosure.

FIG. 5 is a block diagram illustrating a configuration of an information processing device 1B according to a second embodiment of the present disclosure. The differences between the configuration of the information processing device 1B and the configuration illustrated in FIG. 1 are as follows. The information processing device 1B includes a deterioration information deriving unit 13B instead of the deterioration information deriving unit 13A. The storage 6 stores association information 30B instead of the association information 30A. The information processing device 1B includes a time counter 52. The time counter 52 measures an elapsed time by counting the number of clocks such as a system clock, whose cycle is known. The electric vehicle includes a storage 51. The storage 51 is a flash memory or the like. The storage 51 accumulates the following information: the information representing the SOC output from the battery controller 3; the information representing the current value output from the current value sensor 4; and the information representing the temperature output from the temperature sensor 5.

The SOC acquisition unit 21 acquires the information representing the SOC of the battery 2 by reading out the information from the storage 51, and inputs the information to the deterioration information deriving unit 13B as data D1. The current value acquisition unit 22 acquires information representing the current value of the charge or discharge current of the battery 2 by reading out the information from the storage 51, and inputs the information to the deterioration information deriving unit 13B as data D2. The temperature acquisition unit 23 acquires the information representing the temperature of the battery 2 by reading out the information from the storage 51, and inputs the information to the deterioration information deriving unit 13B as data D3. The association information acquisition unit 12 acquires the association information 30B by reading out from the storage 6, and inputs the association information 30B to the deterioration information deriving unit 13B as data D4B.

The association information 30B is the information representing the relationship between the state of the battery 2 (SOC, current value, and temperature) and the category of a cause that causes the deterioration of the battery 2.

In a first example, the association information 30B is obtained as a learned model by machine learning. In a learning phase, the data of the SOC, the current value, and the temperature of the battery 2 with correct labels of the category of cause of deterioration are used as teacher data to construct a learning model, whereby a learned model representing the relationship between each of the SOC, the current value, and the temperature of the battery 2 and the category of cause of deterioration is output. As the learned model, the association information 30B is obtained. Then, in a use phase, the information processing device 1B inputs, to the learned model, the data of the SOC, the current value, and the temperature of the battery 2 as input information, whereby the category of cause of deterioration is output after internal processing of the above learned model. Note that the machine learning algorithm is not particularly limited as long as the above output result can be achieved, and for example, a polynomial classification algorithm such as a support vector machine or a neural network can be used.

Figure 6:
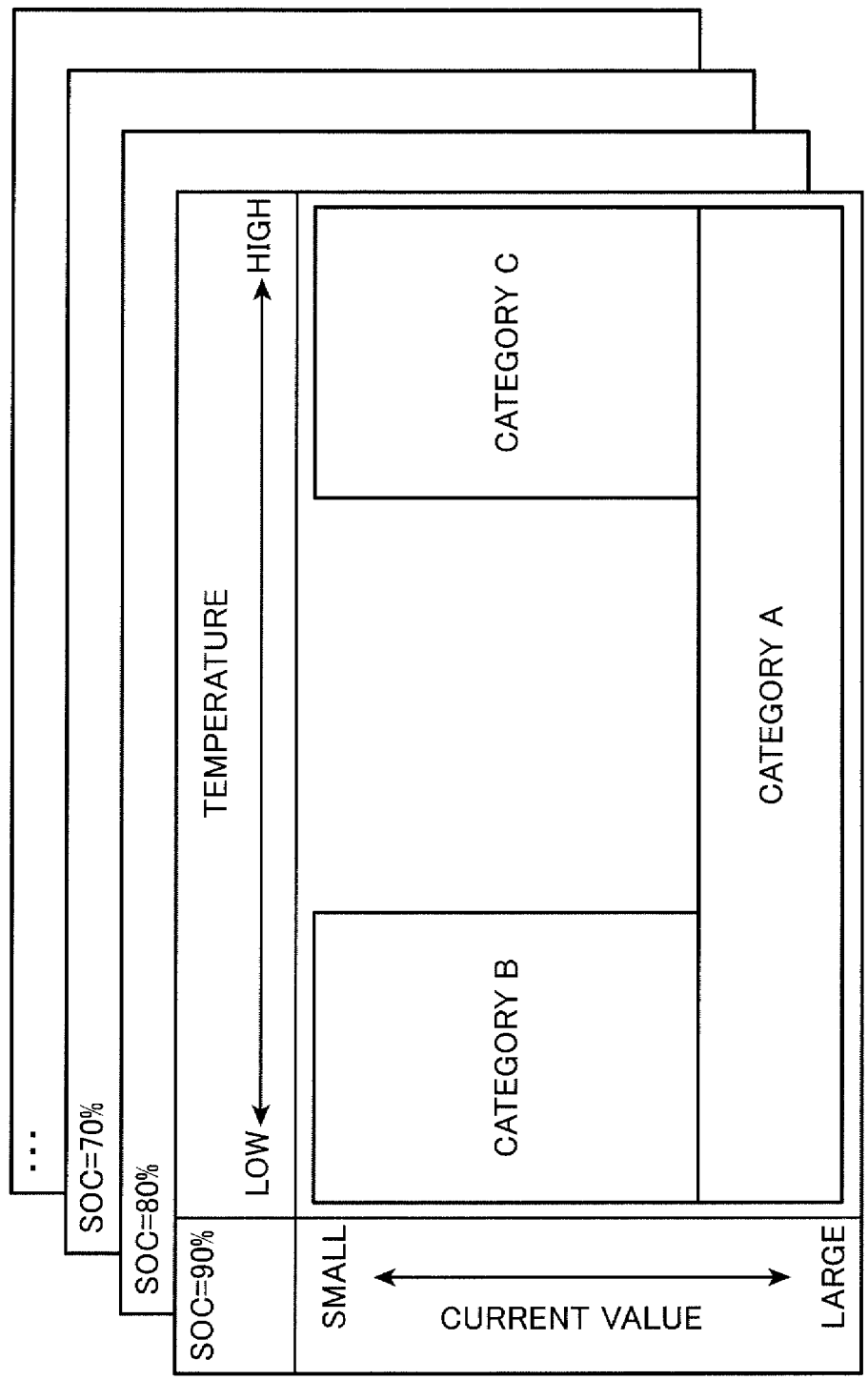
FIG. 6 is a diagram illustrating, in a simplified manner, an example of a three-dimensional data map.

In a second example, the association information 30B is obtained as a three-dimensional data map having the SOC, on which data map the SOC, the current value, and the temperature of the battery 2 are input data, and the category of cause of deterioration is output data. FIG. 6 is a diagram illustrating, in a simplified manner, an example of the three-dimensional data map. The three-dimensional data maps are constructed in the following manner. Two-dimensional data maps having the temperature and the current value as input data and having the categories of cause A to C as output data are each created at predetermined intervals of the SOC (10% interval in this example) In each two-dimensional data map, in a case where the current value of the battery 2 is larger than a predetermined threshold, the case is classified into the category of cause A in which too large a current value is the cause of deterioration. In a case where the current value of the battery 2 is equal to or smaller than the predetermined threshold value and the temperature of the battery 2 is lower than a predetermined allowable lower limit value, the case is classified into the category of cause B in which too low a temperature is the cause of deterioration. In a case where the current value of the battery 2 is equal to or smaller than the predetermined threshold value and the temperature of the battery 2 is higher than a predetermined allowable upper limit value, the case is classified into the category of cause C in which too high a temperature is the cause of deterioration. The above predetermined threshold value, the predetermined allowable lower limit value, and the predetermined allowable upper limit value are individually set for each of the two-dimensional data maps having different SOCs. Regarding the SOC having a value for which the two-dimensional data map is not prepared, it is possible to obtain the predetermined threshold, the predetermined allowable lower limit value, and the predetermined allowable upper limit value described above by interpolation calculation using the two two-dimensional data maps sandwiching the value of the SOC. Note that, as is clear from a comparison between FIG. 2 and FIG. 6, the categories of cause A to C are set for regions having a large ΔSOH. Therefore, the information on the cause of deterioration identified by the classification of the category of cause can be considered as one of pieces of deterioration information related to the deterioration rate of the battery 2.

With reference to FIG. 5, by referring to the association information 30B (the learned model or the three-dimensional data map described above) represented by the data D4B, the deterioration information deriving unit 13B derives the deterioration information (the information on the main cause of deterioration in the present embodiment) related to the deterioration rate of the battery 2 corresponding to the state information (SOC, current value, and temperature) of the battery 2 represented by the data D1 to D3. The deterioration information deriving unit 13B inputs data D5B representing the derived information on the main cause to the output unit 14, and the output unit 14 outputs the data D5B. The data D5B output from the output unit 14 is input to the display 7.

Figure 7:
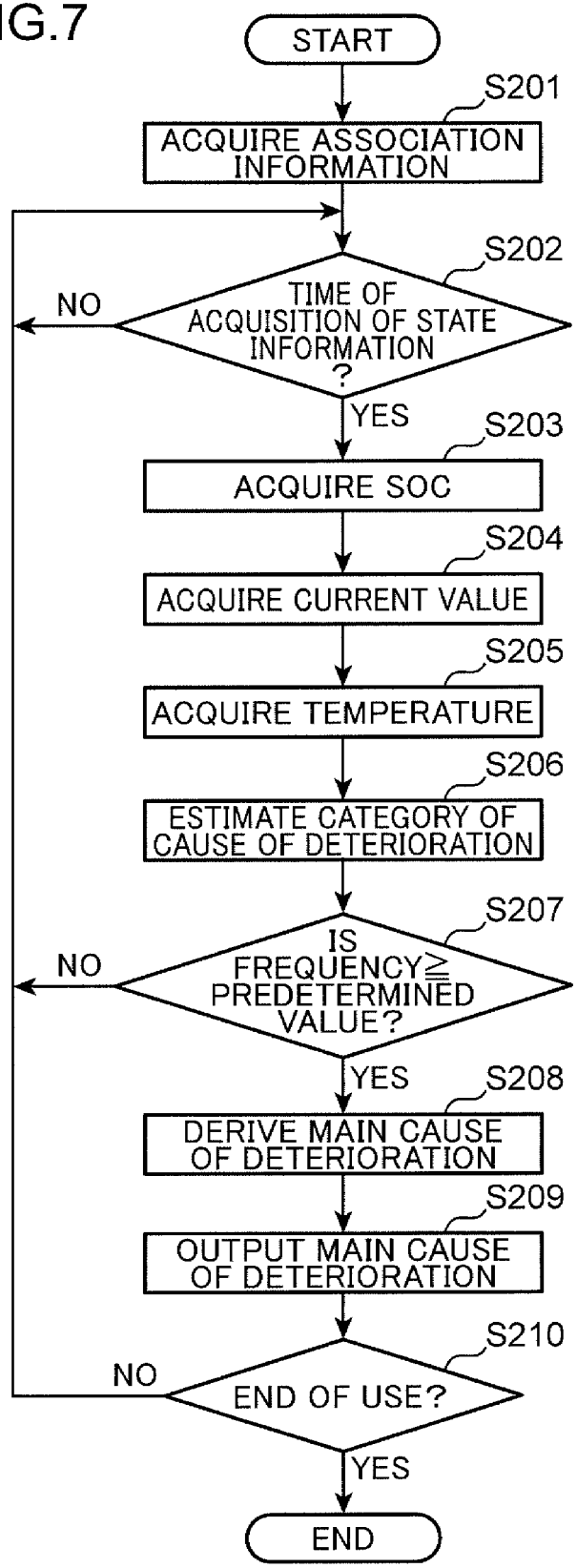
FIG. 7 is a flowchart illustrating a flow of a process performed by the information processing device.

FIG. 7 is a flowchart illustrating a flow of a process performed by the information processing device 1B in an example in which a main cause of the deterioration of the battery 2 occurring when a vehicle is being used is displayed when the vehicle is being used. When the power source of the electric vehicle is turned on and the information processing device 1B is thereby activated, the process starts to be performed. When the power source of the electric vehicle is turned on, the battery controller 3, the current value sensor 4, and the temperature sensor 5 respectively output, at predetermined sampling intervals, the information representing the SOC, the information representing the current value, and the information representing the temperature, and these pieces of state information are accumulated in the storage 51. In the following example, the sampling interval of the state information is one second, but is not limited thereto, and may be any time interval of several milliseconds to several seconds.

First, in step S201, the association information acquisition unit 12 acquires the association information 30B from the storage 6, and inputs the association information 30B to the deterioration information deriving unit 13B.

Next, in step S202, the state information acquisition unit 11 determines if a time of acquisition of the state information has come, on the basis of a measurement result of the elapsed time measured by the time counter 52. In the example of the present embodiment, a target period for determining a cause of deterioration of the battery 2 is set to the latest predetermined period. In the following example, the target period is the latest 10 minutes, but is not limited thereto, and may be any period of several minutes to several hours. The state information acquisition unit 11 determines that the first time of acquisition of the state information has come, on the basis of the fact that 10 minutes have elapsed since the power source of the electric vehicle was turned on.

If the time of acquisition of the state information has not come (step S202: NO), the process in step S202 is repeatedly performed until the time of acquisition of the state information comes.

If the time of acquisition of the state information has come (step S202: YES), next, in step S203, the SOC acquisition unit 21 acquires, from the storage 51, the information representing the SOCs for the latest 10 minutes accumulated in the storage 51, and inputs the information to the deterioration information deriving unit 13B.

Next, in step S204, the current value acquisition unit 22 acquires, from the storage 51, the information representing the current values for the latest 10 minutes accumulated in the storage 51, and inputs the information to the deterioration information deriving unit 13B.

Next, in step S205, the temperature acquisition unit 23 acquires, from the storage 51, the information representing the temperatures for the latest 10 minutes accumulated in the storage 51, and inputs the information to the deterioration information deriving unit 13B.

Next, in step S206, by referring to the association information 30B input in step S201, the deterioration information deriving unit 13B estimates the category of cause of the deterioration of the battery 2 on the basis of the state information (SOC, current value, and temperature) of the battery 2 input in steps S203 to S205. Specifically, with respect to the data set of the SOC, the current value, and the temperature measured at the same time, the deterioration information deriving unit 13B estimates the category of cause of the deterioration on the basis of the association information 30B. The deterioration information deriving unit 13B estimates a category of cause with respect each of all the data sets included in the target period. In this example, the target period is the latest 10 minutes, and the sampling interval for the state information is one second; therefore, there are 600 data sets included in the target period. With respect to each of the 600 data sets, the deterioration information deriving unit 13B estimates a category of cause on the basis of the association information 30B.

Next, in step S207, the deterioration information deriving unit 13B determines if, among all the categories of cause estimated in step S206, there is a frequently appearing category of cause whose frequency of occurrence is equal to or higher than a predetermined value.

If there is no frequently appearing category of cause (step S207: NO), the process returns to step S202, and the same process as described above is performed. Regarding the second and subsequent acquisition of the state information, the time when a predetermined time has elapsed from the previous time of acquisition is set as the next time of acquisition. The predetermined time is an arbitrary time equal to or longer than the sampling interval of the state information, and is set to 10 seconds in the following example. In this example, the state information acquisition unit 11 newly acquires the state information for the latest 10 seconds from the storage 51 and inputs the state information to the deterioration information deriving unit 13B. The deterioration information deriving unit 13B discards the state information for the oldest 10 seconds out of the state information for the 10 minute periods that the deterioration information deriving unit 13B holds, and adds the state information for the new 10 seconds input from the state information acquisition unit 11, whereby, the deterioration information deriving unit 13B performs the same process as described above with respect to the updated latest 10 minute target period.

If there is a frequently appearing category of cause (step S207: YES), next, in step S208, the deterioration information deriving unit 13B derives the frequently appearing category of cause as the main cause that causes the deterioration of the battery 2.

Next, in step S209, the output unit 14 outputs the data D5B representing the main cause of the deterioration derived in step S208. The data D5B output from the output unit 14 is input to the display 7.

Next, in step S210, the information processing device 1B determines if the use of the electric vehicle is ended, on the basis of whether the power source of the electric vehicle is turned off.

If the use of the electric vehicle is not ended (step S210: NO), the information processing device 1B repeatedly performs the process of steps S202 to S210.

If the use of the electric vehicle is ended (step S210: YES), the information processing device 1B ends the process.

By the above process, the main cause of the deterioration of the battery 2 occurring when the electric vehicle is being used is presented to the user when the electric vehicle is being used.

Figure 8:
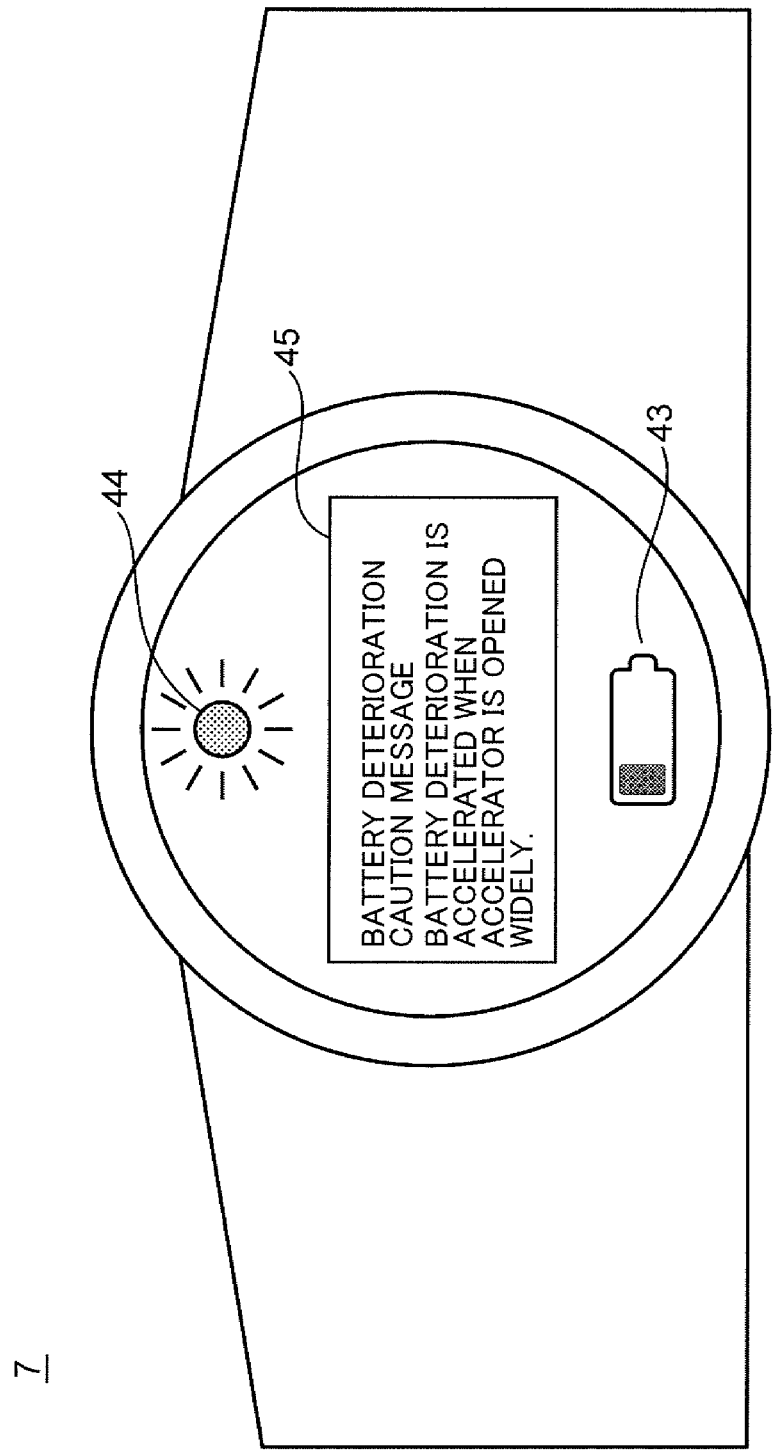
FIG. 8 is a diagram illustrating a display example of a main cause of deterioration on the display.

FIG. 8 is a diagram illustrating a display example of the main cause of deterioration on the display 7. A graphic 44 imitating a warning light is turned on when the main cause of deterioration is included in the latest target period, and is turned off when the main cause of deterioration is not included in the latest target period. The message display area 45 displays a text message for notifying the user of the content of the main cause of deterioration. In the example shown in FIG. 8, the fact that too large a current value of the battery 2 during the latest target period is the main cause of the deterioration is derived, and as a result, the message display area 45 displays a text message for notifying that the deterioration of the battery 2 is accelerated when the degree of opening of the accelerator is large. However, when there are a plurality of main causes of the deterioration in the same target period, the plurality of main causes may be simultaneously displayed in the message display area 45.

Figure 9:
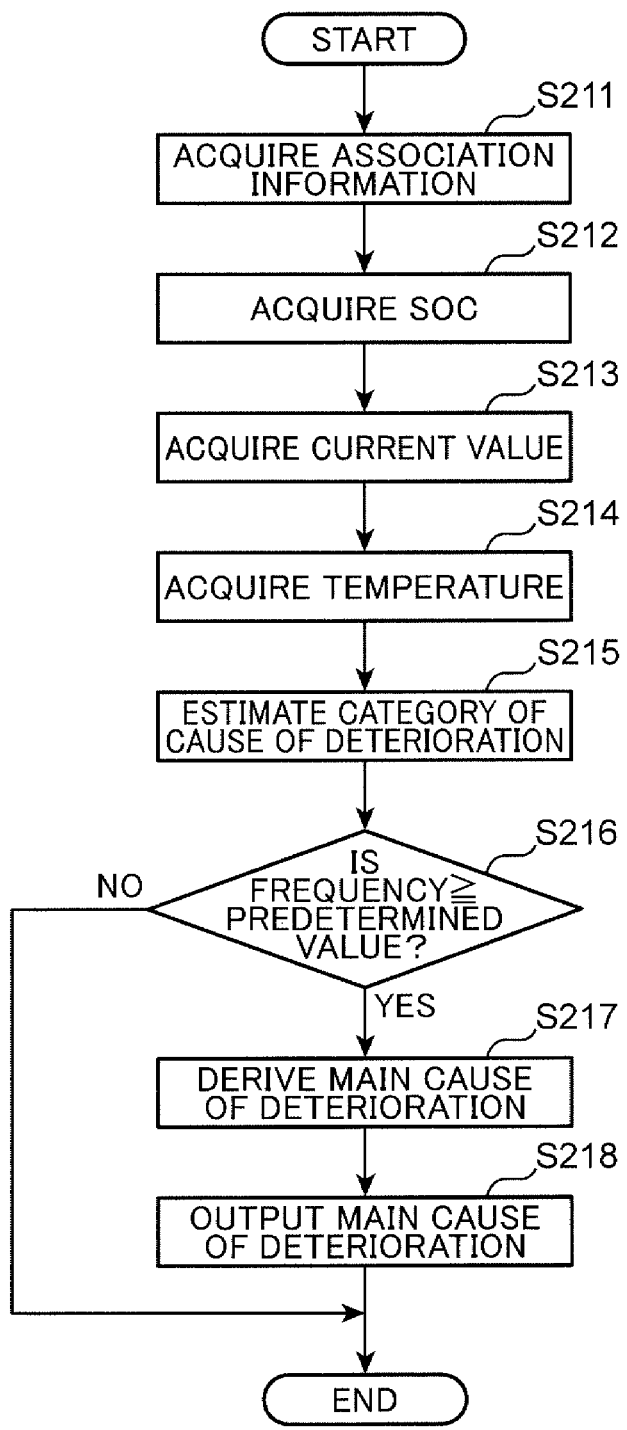
FIG. 9 is a flowchart illustrating a flow of a process performed by the information processing device.

FIG. 9 is a flowchart illustrating a flow of a process performed by the information processing device 1B in an example in which a main cause of the deterioration of the battery 2 having occurred when a vehicle was being used is displayed after the vehicle is used. When the power source of the electric vehicle is turned on, the battery controller 3, the current value sensor 4, and the temperature sensor 5 respectively output, at predetermined sampling intervals (one second in this example), the state information (SOC, current value, and temperature) of the battery 2, and these pieces of state information are accumulated in the storage 51.

When the power source of the electric vehicle is turned off and the information processing device 1B is thereby activated, the process illustrated in FIG. 9 starts to be performed.

First, in step S211, the association information acquisition unit 12 acquires the association information 30B from the storage 6, and inputs the association information 30B to the deterioration information deriving unit 13B.

Next, in step S212, the SOC acquisition unit 21 acquires, from the storage 51, the information representing the SOC accumulated in the storage 51 through the latest use (in other words, the period from when the power source of the electric vehicle was turned on to when the power source was turned off), and inputs the information to the deterioration information deriving unit 13B.

Next, in step S213, the current value acquisition unit 22 acquires, from the storage 51, the information representing the current values accumulated in the storage 51 through the latest use, and inputs the information to the deterioration information deriving unit 13B.

Next, in step S214, the temperature acquisition unit 23 acquires, from the storage 51, the information representing the temperature in the storage 51 accumulated through the latest use, and inputs the information to the deterioration information deriving unit 13B.

Next, in step S215, by referring to the association information 30B input in step S211, the deterioration information deriving unit 13B estimates the category of cause of the deterioration of the battery 2 on the basis of the state information (SOC, current value, and temperature) of the battery 2 input in steps S212 to S214. That is, the deterioration information deriving unit 13B estimates the category of cause on the basis of the association information 30B, with respect to each of all the data sets of the state information accumulated in the storage 51 through the latest use.

Next, in step S216, the deterioration information deriving unit 13B determines if, among all the categories of cause estimated in step S215, there is a frequently appearing category of cause whose frequency of occurrence is equal to or higher than a predetermined value.

If there is no frequently appearing category of cause (step S216: NO), the information processing device 1B ends the process.

If there is a frequently appearing category of cause (step S216: YES), next, in step S217, the deterioration information deriving unit 13B derives the frequently appearing category of cause as the main cause that causes the deterioration of the battery 2.

Next, in step S218, the output unit 14 outputs the data D5B representing the main cause of the deterioration derived in step S217. The data D5B output from the output unit 14 is input to the display 7.

By the above process, the main cause of the deterioration of the battery 2 having occurred during the latest use of the electric vehicle is presented to the user after the electric vehicle is used. For example, when the fact that too high a temperature during the latest use is the main cause of the deterioration of the battery 2 is derived, the message display area 45 in illustrated in FIG. 8 displays a text message for notifying that the deterioration of the battery 2 is accelerated when the operating temperature is too high.

Figure 10:
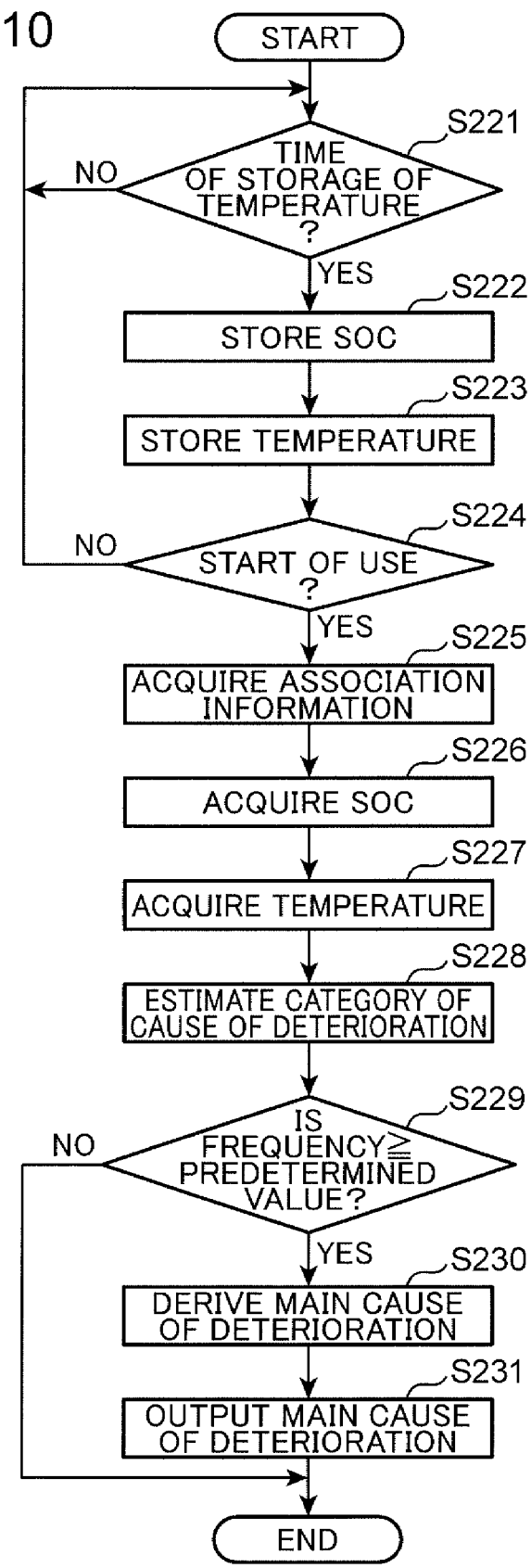
FIG. 10 is a flowchart illustrating a flow of a process performed by the information processing device.

FIG. 10 is a flowchart illustrating a flow of a process performed by the information processing device 1B in an example in which a main cause of the deterioration of the battery 2 having occurred during storage of a vehicle is displayed after the vehicle starts to be used. When the power source of the electric vehicle is turned off and the information processing device 1B is thereby activated, the process starts to be performed.

First, in step S221, on the basis of a measurement result of the elapsed time measured by the time counter 52, the information processing device 1B determines if the time of storing at which the state information on the battery 2 is stored has come. The information processing device 1B determines that the time of storing of the state information on the battery 2 has come every time a predetermined time interval elapses from the time when the power source of the electric vehicle is turned off. In the following example, the predetermined time interval is one hour, but is not limited thereto, and may be any time period of several minutes to several hours.

If the time of storing of the state information has not come (step S221: NO), the process in step S221 is repeatedly performed until the time of storing of the state information comes.

If the time of storing of the state information has come (step S221: YES), next, in step S222, the information processing device 1B causes the battery controller 3 to output the information representing the SOC of the battery 2 at that point of time, and stores the information in the storage 51.

Next, in step S223, the information processing device 1B causes the temperature sensor 5 to output information representing the temperature of the battery 2 at that point time, and stores the information in the storage 51.

Next, in step S224, the information processing device 1B determines if the electric vehicle has started to be used, on the basis of whether the power source of the electric vehicle is turned on.

In a case where the use of the electric vehicle is not started (step S224: NO), the information processing device 1B repeatedly executes the process of steps S221 to S224.

If the use of the electric vehicle is started (step S224: YES), next, in step S225, the association information acquisition unit 12 acquires the association information 30B from the storage 6, and inputs the association information 30B to the deterioration information deriving unit 13B.

Figure 11:
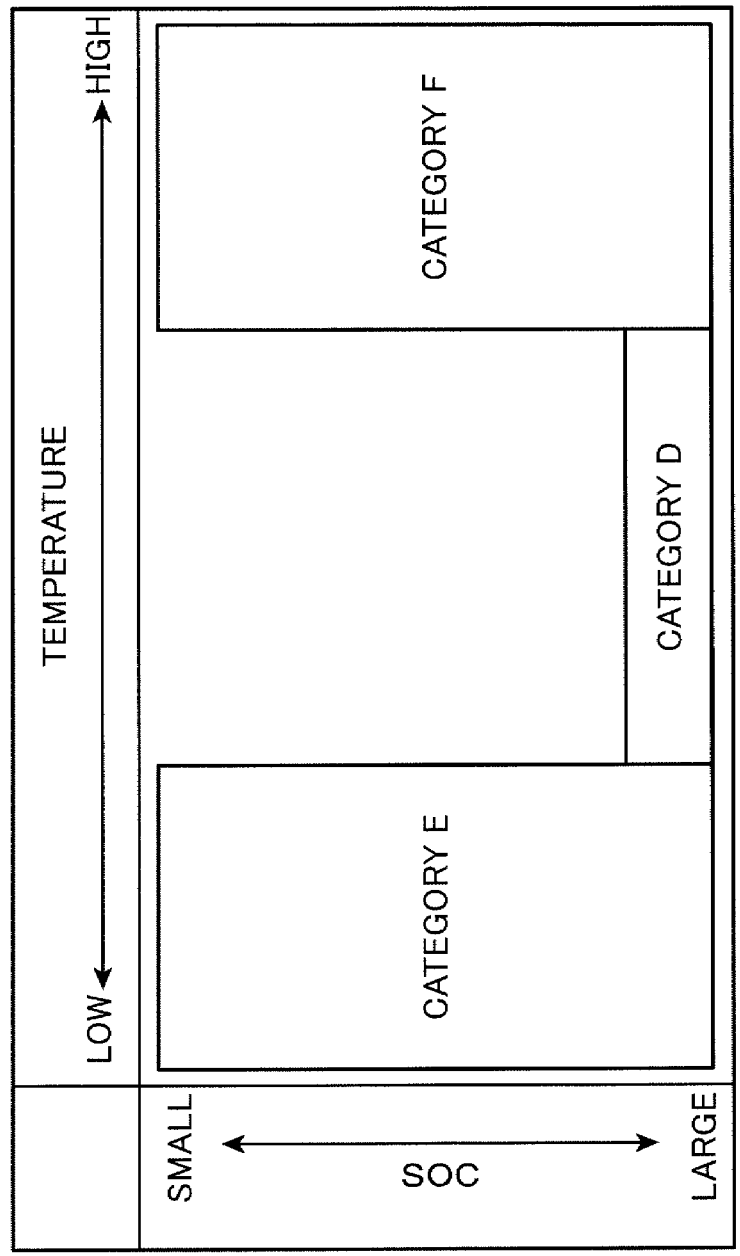
FIG. 11 is a diagram illustrating, in a simplified manner, a two-dimensional data map that is an example of association information.

FIG. 11 is a diagram illustrating, in a simplified manner, a two-dimensional data map that is an example of the association information 30B. There is constructed a two-dimensional data map in which the temperature and the SOC of the battery 2 are input data and the categories of cause D to F are output data. In a case where the temperature of the battery 2 is lower than a predetermined allowable lower limit value, the case is classified into the category of cause E in which too low a temperature is the cause of the deterioration. In a case where the temperature of the battery 2 is higher than a predetermined allowable upper limit value, the case is classified into the category of cause F in which too high a temperature is the cause of the deterioration. In a case where the temperature of the battery 2 is equal to or higher than the allowable lower limit value and equal to or lower than the allowable upper limit value and the SOC is equal to or larger than a predetermined threshold value, the case is classified into the category of cause D in which too large an SOC is the cause of deterioration.

With reference to FIG. 10, next, in step S226, the SOC acquisition unit 21 acquires, from the storage 51, the information representing the SOC accumulated in the storage 51 through the latest storage (in other words, the period from when the power source of the electric vehicle was turned off to when the power source was turned on), and inputs the information to the deterioration information deriving unit 13B.

Next, in step S227, the temperature acquisition unit 23 acquires, from the storage 51, the information representing the temperature in the storage 51 accumulated through the latest storage, and inputs the information to the deterioration information deriving unit 13B.

Next, in step S228, by referring to the association information 30B input in step S225, the deterioration information deriving unit 13B estimates the category of cause of the deterioration of the battery 2 on the basis of the state information (SOC and temperature) of the battery 2 input in steps S226 and S227. That is, the deterioration information deriving unit 13B estimates the category of cause on the basis of the association information 30B, with respect to each of all the data sets of the state information accumulated in the storage 51 through the latest storage.

Next, in step S229, the deterioration information deriving unit 13B determines if, among all the categories of cause estimated in step S228, there is a frequently appearing category of cause whose frequency of occurrence is equal to or higher than a predetermined value.

If there is no frequently appearing category of cause (step S229: NO), the information processing device 1B ends the process.

If there is a frequently appearing category of cause (step S229: YES), next, in step S230, the deterioration information deriving unit 13B derives the frequently appearing category of cause as the main cause that causes the deterioration of the battery 2.

Next, in step S231, the output unit 14 outputs the data D5B representing the main cause of the deterioration derived in step S230. The data D5B output from the output unit 14 is input to the display 7.

By the above process, the main cause of the deterioration of the battery 2 having occurred during the latest storage of the electric vehicle is presented to the user after the electric vehicle starts to be used. For example, when the fact that too large an SOC during the latest storage is the main cause of the deterioration of the battery 2 is derived, the message display area 45 illustrated in FIG. 8 displays a text message for notifying that the deterioration of the battery 2 is accelerated when the battery 2 is stored in a state close to a fully charged state.

The present embodiment makes it possible to present, to the user, information on the main cause that causes the deterioration of the battery 2. As a result, the user can easily understand how his or her way of driving or storage directly affects the deterioration of the battery 2.

Third Embodiment

Figure 12:
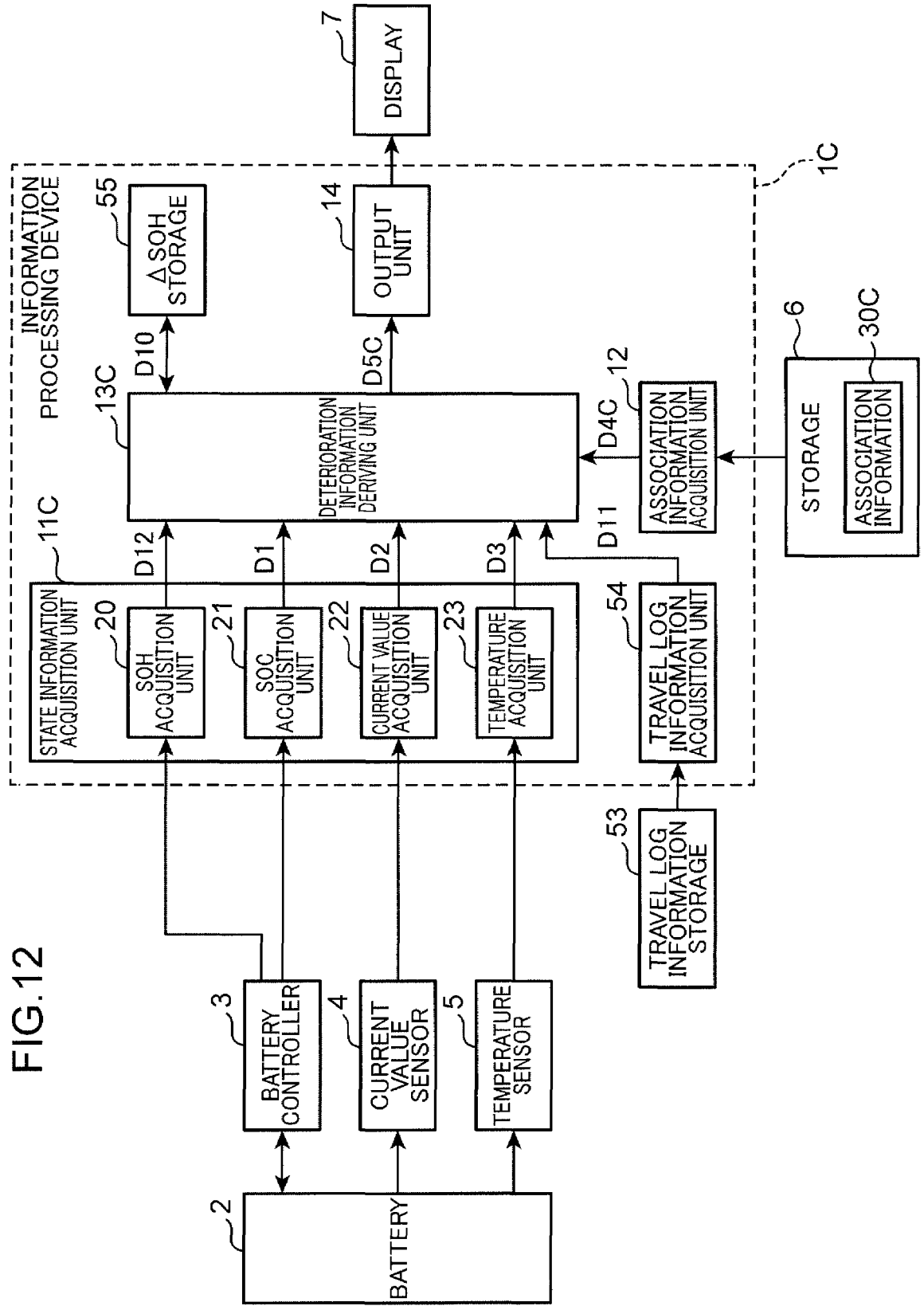
FIG. 12 is a block diagram illustrating a configuration of an information processing device according to a third embodiment of the present disclosure.

FIG. 12 is a block diagram illustrating a configuration of an information processing device 1C according to a third embodiment of the present disclosure. The differences between the configuration of the information processing device 1C and the configuration illustrated in FIG. 1 are as follows. The information processing device 1C includes a deterioration information deriving unit 13C instead of the deterioration information deriving unit 13A. The information processing device 1C includes a state information acquisition unit 11C instead of the state information acquisition unit 11. State information acquisition unit 11C includes an SOH acquisition unit 20. The storage 6 stores association information 30C instead of the association information 30A. The information processing device 1C includes a travel log information acquisition unit 54 and a $\Delta$SOH storage 55. The $\Delta$SOH storage 55 is a ROM, a RAM, or the like. The electric vehicle includes a travel log information storage 53. The travel log information storage 53 is a flash memory or the like. The travel log information storage 53 accumulates travel log information such as a travel time, a travel distance, and a travel speed of the electric vehicle.

The SOH acquisition unit 20 acquires the information representing the SOH as the deterioration degree of the battery 2 from the battery controller 3, and inputs the information to the deterioration information deriving unit 13C as data D12.

The travel log information acquisition unit 54 acquires the travel log information by reading out the travel log information from the travel log information storage 53, and inputs the travel log information to the deterioration information deriving unit 13C as data D11.

The association information acquisition unit 12 acquires the association information 30C by reading out from the storage 6, and inputs the association information 30C to the deterioration information deriving unit 13C as data D4C. Similarly to the association information 30A, the association information 30C is information representing the relationship between the state of the battery 2 (SOC, current value, and temperature) and the deterioration rate ($\Delta$SOH) of the battery 2.

By referring to the association information 30C represented by the data D4C, the deterioration information deriving unit 13C derives the $\Delta$SOH corresponding to the data sets of the data D1 to D3. The deterioration information deriving unit 13C inputs the derived $\Delta$SOH to the $\Delta$SOH storage 55 as data D10. As a result, the $\Delta$SOH derived by the deterioration information deriving unit 13C is stored in the $\Delta$SOH storage 55. The deterioration information deriving unit 13C repeatedly performs these series of processes at predetermined sampling intervals (one second in this example). As a result, the $\Delta$SOH corresponding to each of the plurality of data sets is stored in the $\Delta$SOH storage 55.

In addition, on the basis of the travel log information input as the data D11 from the travel log information acquisition unit 54 and the $\Delta$SOH read out from the $\Delta$SOH storage 55, the deterioration information deriving unit 13C calculates an average value of the $\Delta$SOH per unit time or per unit travel distance (average deterioration rate) in the latest use (in other words, the period from when the power source of the electric vehicle was turned on to when the power source was turned off). On the basis of the present SOH input as the data D12 from the SOH acquisition unit 20 and the calculated average deterioration rate, the deterioration information deriving unit 13C derives the first remaining life that is the remaining life of the battery 2 corresponding to the average deterioration rate. In an example where the average deterioration rate is calculated on the basis of time, the first remaining life of the battery 2 is calculated as (80−50)/0.002=15,000 (min) in the case where the present SOH is 80 (%), the lower limit SOH recommended by the manufacturer is 50 (%), and the average deterioration rate is 0.002 (%/min). In an example where the average deterioration rate is calculated on the basis of travel distance, the first remaining life of the battery 2 is (80−50)/0.002=15,000 (km) in the case where the present SOH is 80 (%), the lower limit SOH recommended by the manufacturer is 50 (%), and the average deterioration rate is 0.002 (%/km). Since the first remaining life varies in accordance with the ΔSOH, the first remaining life can be considered as one of pieces of deterioration information related to the deterioration rate of the battery 2.

In addition, with respect to temperature, current value, and the like, the deterioration rate of the battery 2 under standard use conditions (the deterioration rate is a standard deterioration rate), which contain no wasteful deterioration factors, is previously set, and the set information is held by the deterioration information deriving unit 13C. On the basis of the present SOH input as the data D12 from the SOH acquisition unit 20 and the standard deterioration rate, the deterioration information deriving unit 13C derives the second remaining life that is the remaining life of the battery 2 corresponding to the standard deterioration rate. In an example where the standard deterioration rate is set on the basis of time, the second remaining life of the battery 2 is calculated as (80−50)/0.0015=20,000 (min), in the case where the present SOH is 80 (%), the lower limit SOH recommended by the manufacturer is 50 (%), and the standard deterioration rate is 0.0015 (%/min). In an example where the standard deterioration rate is set on the basis of travel distance, the second remaining life of the battery 2 is calculated as (80−50)/0.0015=20,000 (km) in the case where the present SOH is 80 (%), the lower limit SOH recommended by the manufacturer is 50 (%), and the standard deterioration rate is 0.0015 (%/km). The deterioration information deriving unit 13C derives a remaining life difference between the first remaining life and the second remaining life by subtracting the first remaining life from the second remaining life. Since the remaining life difference varies in accordance with the ΔSOH, the remaining life difference can be considered as one of pieces of deterioration information related to the deterioration rate of the battery 2.

The deterioration information deriving unit 13C inputs data D5C representing the derived first remaining life and the remaining life difference to the output unit 14, and the output unit 14 outputs the data D5C. The data D5C output from the output unit 14 is input to the display 7.

Figure 13A:
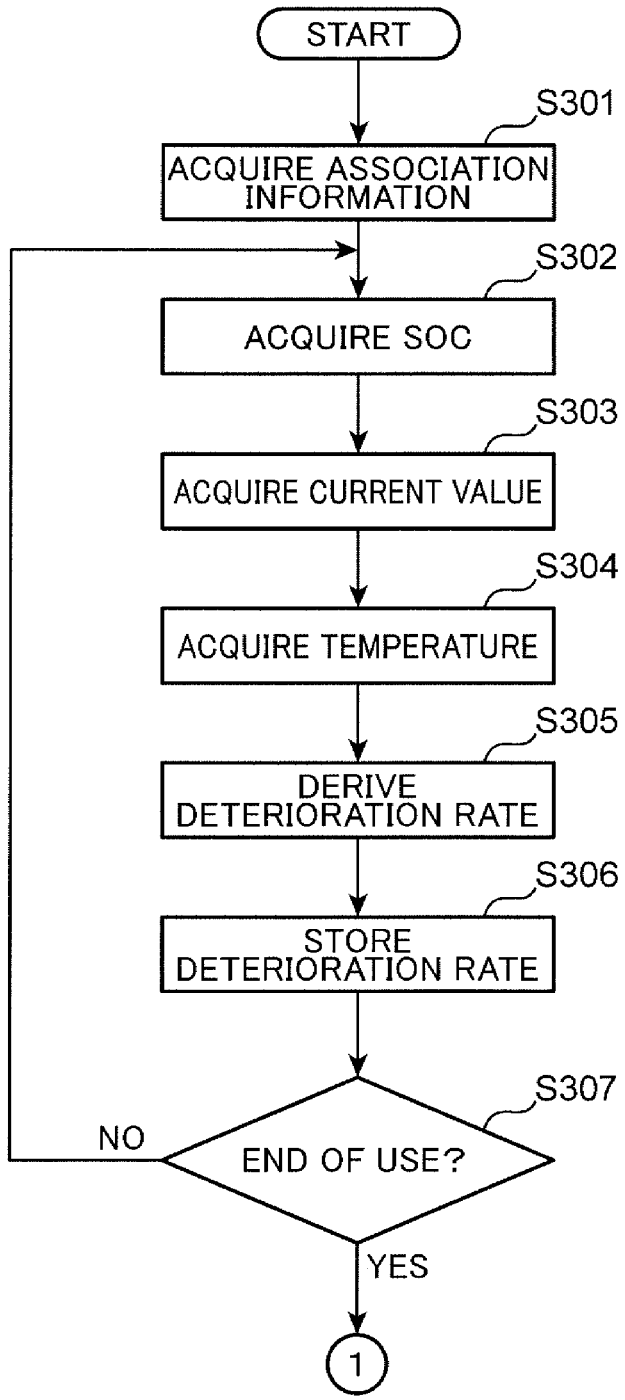
FIG. 13A is a flowchart illustrating a flow of a process performed by the information processing device.
Figure 13B:
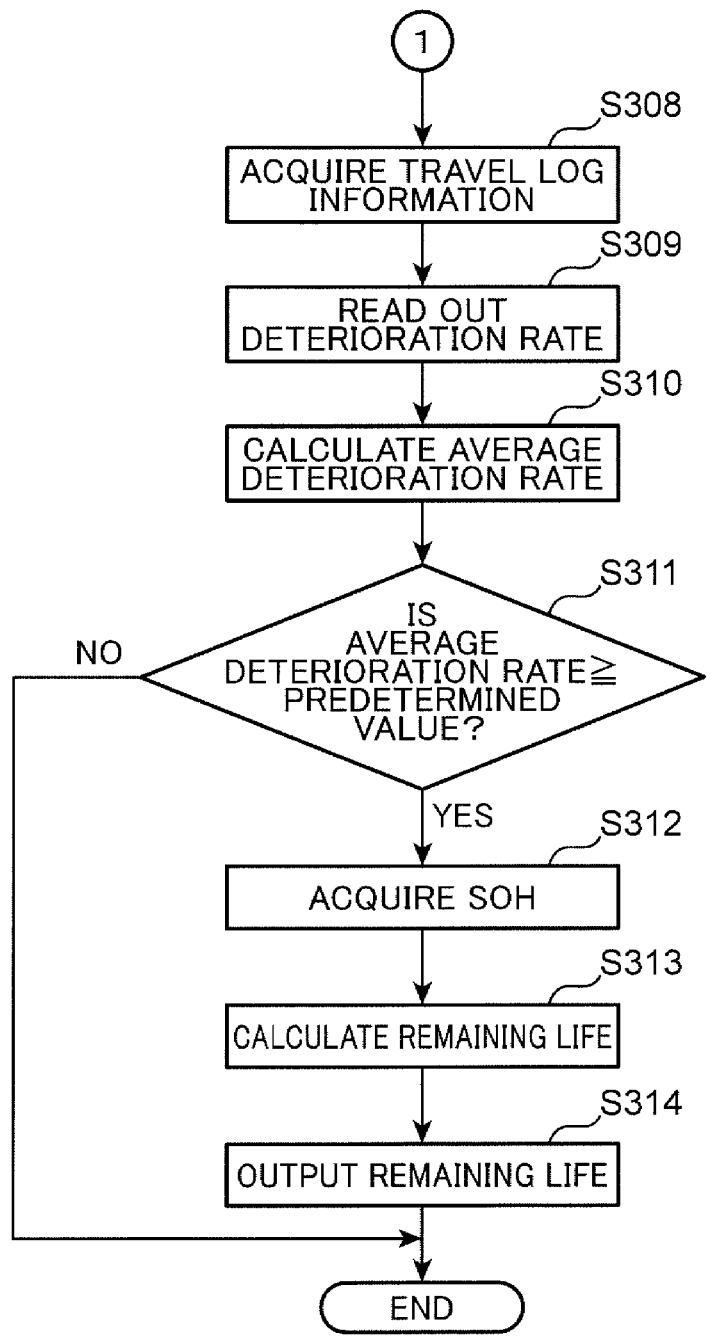
FIG. 13B is a flowchart illustrating a flow of the process performed by the information processing device.

FIGS. 13A and 13B are flowcharts illustrating a flow of a process performed by the information processing device 1C. The flowcharts illustrated in FIGS. 13A and 13B are connected to each other by a connection point 1. When the power source of the electric vehicle is turned on and the information processing device 1C is thereby activated, the process starts to be performed.

First, in step S301, the association information acquisition unit 12 acquires the association information 30C from the storage 6, and inputs the association information 30C to the deterioration information deriving unit 13C.

Next, in step S302, the SOC acquisition unit 21 acquires the information representing the SOC of the battery 2 from the battery controller 3, and inputs the information to the deterioration information deriving unit 13C.

Next, in step S303, the current value acquisition unit 22 acquires information representing the current value of the charge or discharge current of the battery 2 from the current value sensor 4, and inputs the information to the deterioration information deriving unit 13C.

Next, in step S304, the temperature acquisition unit 23 acquires information representing the temperature of the battery 2 from the temperature sensor 5, and inputs the information to the deterioration information deriving unit 13C.

Next, in step S305, the deterioration information deriving unit 13C refers to the association information 30C input in step S301 to derive the ΔSOH of the battery 2 corresponding to the data set of state information input in steps S302 to S304.

Next, in step S306, the deterioration information deriving unit 13C stores the ΔSOH derived in step S305 in the ΔSOH storage 55.

Next, in step S307, the information processing device 1C determines if the use of the electric vehicle is ended, on the basis of whether the power source of the electric vehicle is turned off.

If the use of the electric vehicle is not ended (step S307: NO), the information processing device 1C repeatedly performs the process of steps S302 to S307 at predetermined sampling intervals (for example, at one second intervals).

If the use of the electric vehicle is ended (step S307: YES), next, in step S308, the travel log information acquisition unit 54 acquires, from the travel log information storage 53, the travel log information accumulated in the latest use (in other words, the period from when the power source of the electric vehicle was turned on to when the power source was turned off), and inputs the travel log information to the deterioration information deriving unit 13C.

Next, in step S309, the deterioration information deriving unit 13C reads out, from the ΔSOH storage 55, the ΔSOH accumulated in the latest use.

Next, in step S310, the deterioration information deriving unit 13C calculates the average deterioration rate in the latest use on the basis of the travel log information acquired in step S308 and the ΔSOH read out in step S309.

Next, in step S311, the deterioration information deriving unit 13C determines if the average deterioration rate calculated in step S310 is equal to or greater than a previously set predetermined value. For example, the above standard deterioration rate may be set as the predetermined value.

If the average deterioration rate is less than the predetermined value (step S311: NO), the information processing device 1C ends the process.

If the average deterioration rate is equal to or greater than the predetermined value (step S311: YES), next, in step S312, the SOH acquisition unit 20 acquires the present SOH of the battery 2 from the battery controller 3, and inputs the information to the deterioration information deriving unit 13C.

Next, in step S313, the deterioration information deriving unit 13C derives the first remaining life of the battery 2 on the basis of the present SOH input in step S312 and the average deterioration rate calculated in step S310. The deterioration information deriving unit 13C derives the second remaining life of the battery 2 on the basis of the present SOH input in step S312 and the standard deterioration rate. Further, the deterioration information deriving unit 13C derives a remaining life difference between the first remaining life and the second remaining life by subtracting the first remaining life from the second remaining life.

Next, in step S314, the output unit 14 outputs data D5C representing the first remaining life and the remaining life difference derived in step S313. The data D5C output from the output unit 14 is input to the display 7.

Figure 14:
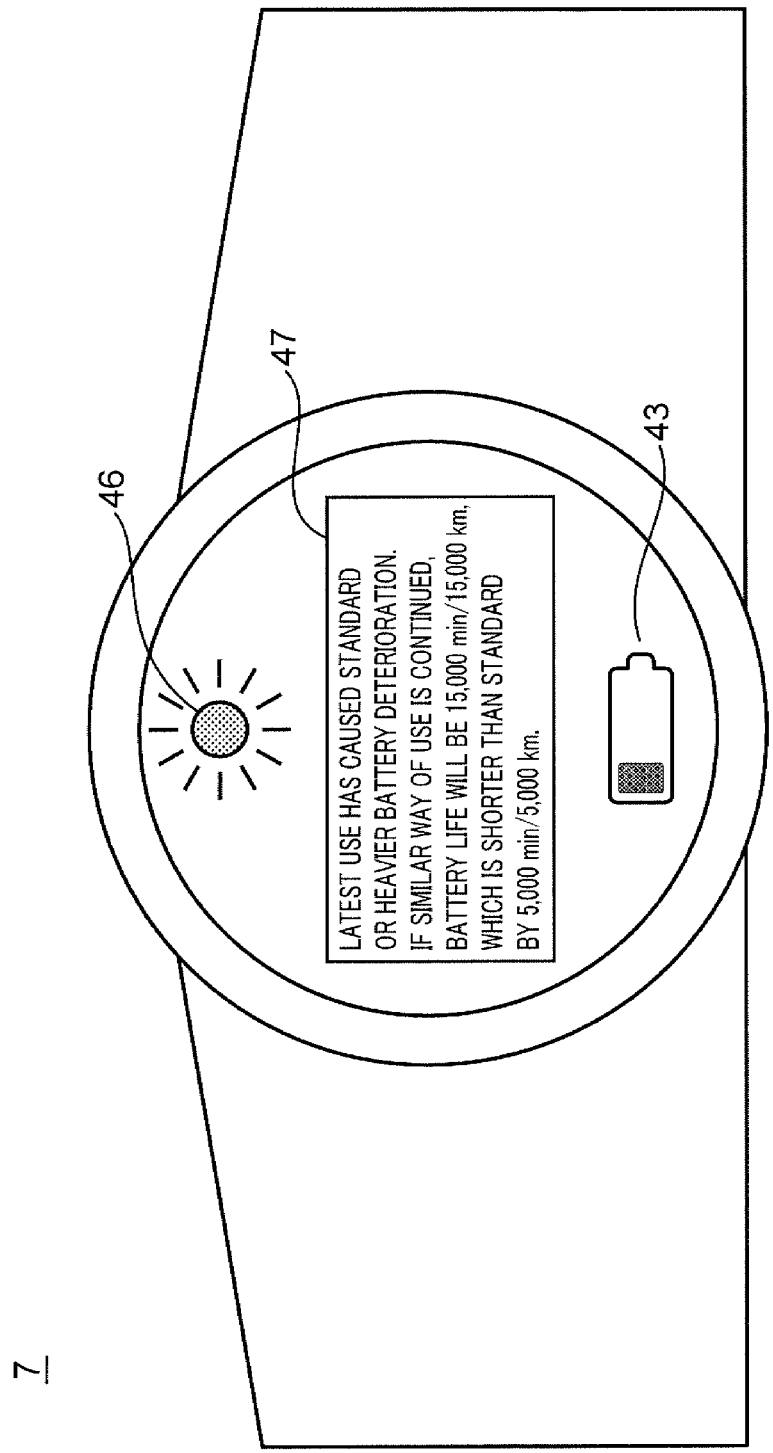
FIG. 14 is a diagram illustrating a display example of displaying a remaining life of a battery on the display.

FIG. 14 is a diagram illustrating a display example of displaying the remaining life of the battery 2 on the display 7. A graphic 46 imitating a warning light is turned on when a normal or higher level of deterioration has occurred in the battery 2, and the graphic 46 is turned off when such a deterioration has not occurred. The message display area 47 displays a text message for notifying the user of the remaining life of the battery 2. In the example illustrated in FIG. 14, the message display area 47 displays a text message notifying of the first remaining life of "15,000 min/15,000 km" and the remaining life difference of "5,000 min/5,000 km".

The present embodiment makes it possible to present, to the user, the first remaining life, which is the remaining life of the battery 2 corresponding to the ΔSOH, and the remaining life difference. As a result, it is possible to further improve the user's awareness of the deterioration of the battery 2.

Fourth Embodiment

Figure 15:
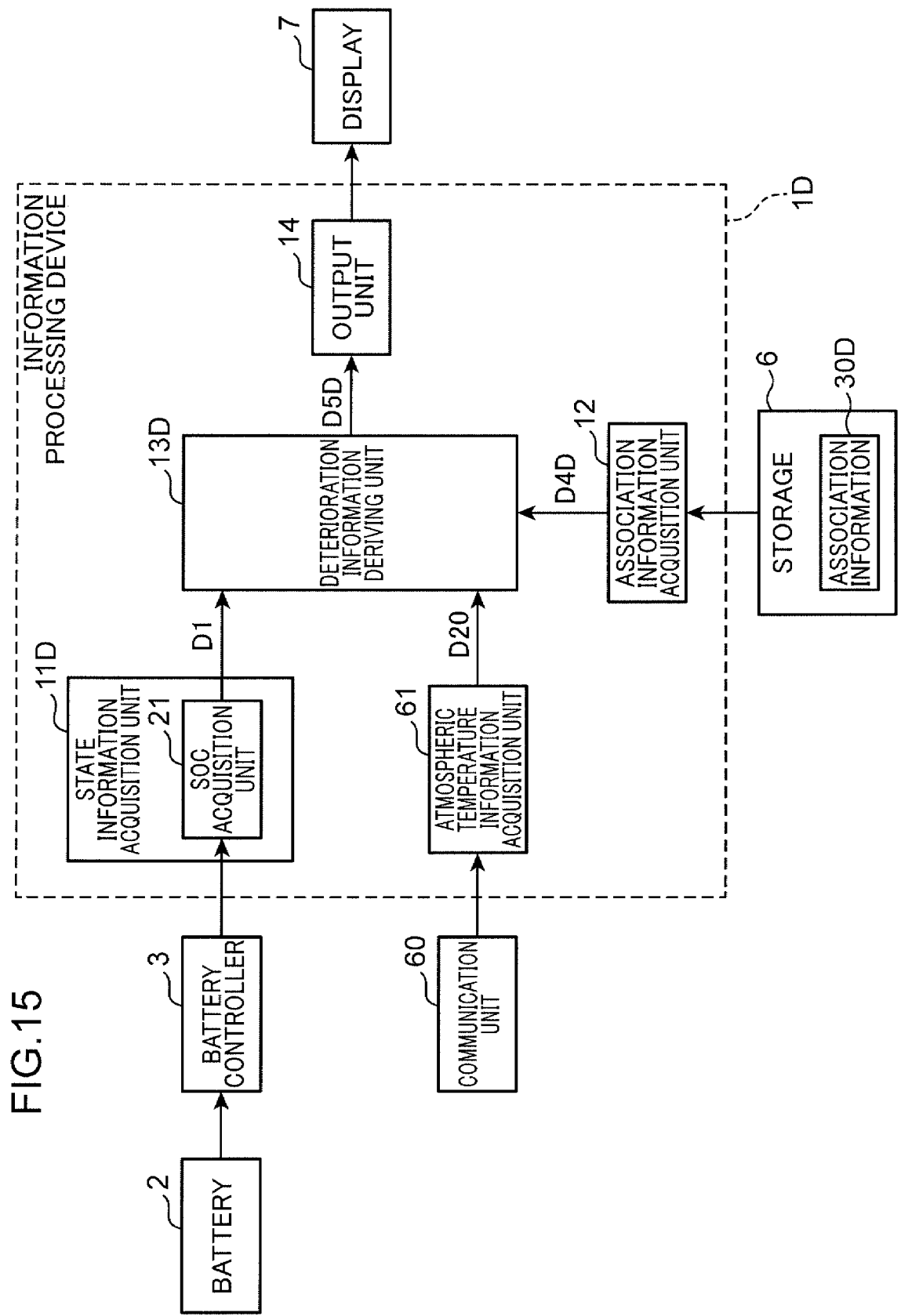
FIG. 15 is a block diagram illustrating a configuration of an information processing device according to a fourth embodiment of the present disclosure.

FIG. 15 is a block diagram illustrating a configuration of an information processing device 1D according to a fourth embodiment of the present disclosure. The differences between the configuration of the information processing device 1D and the configuration illustrated in FIG. 1 are as follows. The information processing device 1D includes a deterioration information deriving unit 13D instead of the deterioration information deriving unit 13A. The information processing device 1D includes a state information acquisition unit 11D instead of the state information acquisition unit 11. In the state information acquisition unit 11D, the current value acquisition unit 22 and the temperature acquisition unit 23 illustrated in FIG. 1 are not mounted. The storage 6 stores association information 30D instead of the association information 30A. The information processing device 1D includes an atmospheric temperature information acquisition unit 61. The electric vehicle includes a communication unit 60. The communication unit 60 is a communication module for performing wireless communication with a server device (not illustrated) that provides a weather forecast service via an arbitrary communication network such as the IP network.

The atmospheric temperature information acquisition unit 61 acquires, from the above server device via the communication unit 60, predicted highest atmospheric temperature information for a predetermined period (for example, for one week) included in a weather forecast for the current location of the electric vehicle, and inputs the information to the deterioration information deriving unit 13D as data D20.

The association information acquisition unit 12 acquires the association information 30D by reading out from the storage 6, and inputs the association information 30D to the deterioration information deriving unit 13B as data D4D.

The association information 30D is the information representing the relationship between each of the state of the battery 2 (SOC) and the predicted highest atmospheric temperature for the current location and the category of cause that causes deterioration of the battery 2.

Figure 16:
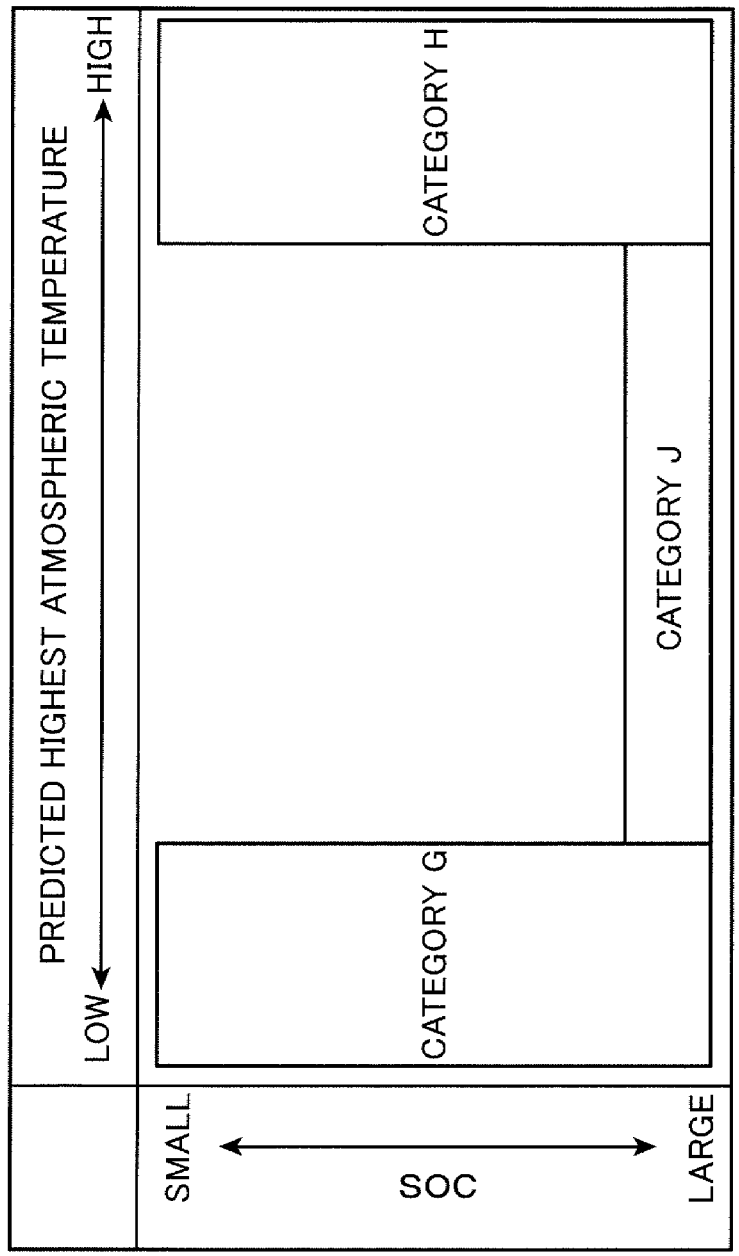
FIG. 16 is a diagram illustrating, in a simplified manner, a two-dimensional data map that is an example of association information.

FIG. 16 is a diagram illustrating, in a simplified manner, a two-dimensional data map that is an example of the association information 30D. There is constructed a two-dimensional data map in which the predicted highest atmospheric temperature for the current location is input data and in which the SOC of the battery 2 and the categories of cause G, H, and J are output data. In a case where the predicted highest atmospheric temperature is lower than a predetermined allowable lower limit value, the case is classified into the category of cause G in which too low a temperature is the cause of the deterioration. In a case where the predicted highest atmospheric temperature is higher than a predetermined allowable upper limit value, the case is classified into the category of cause H in which too high a temperature is the cause of the deterioration. In a case where the predicted highest atmospheric temperature is equal to or higher than the allowable lower limit value and equal to or lower than the allowable upper limit value and the SOC is equal to or larger than a predetermined threshold value, the case is classified into the category of cause J in which too large an SOC is the cause of deterioration.

With reference to FIG. 15, by referring to the association information 30D represented by the data D4D, the deterioration information deriving unit 13D performs classification into the categories of cause G, H, and J on the basis of the SOC of the battery 2 represented by the data D1 and the predicted highest atmospheric temperature represented by the data D20. In addition, the deterioration information deriving unit 13D derives advice information that represents a preferable storage condition of the vehicle for avoiding the deterioration cause of each of the categories of cause G, H, and J. The content of the advice information is determined in advance in correspondence to the deterioration cause of each of the categories of cause G, H, and J.

With respect to the category of cause G into which the case where the predicted highest atmospheric temperature is lower than the allowable lower limit value is classified, the following text message is set as the advice information, for example. "The atmospheric temperature is predicted to become low. To avoid deterioration of the battery, store the vehicle in a place where the temperature is not likely to become low". With respect to the category of cause H into which the case where the predicted highest atmospheric temperature is higher than the allowable upper limit value is classified, the following text message is set as the advice information, for example. "The atmospheric temperature is predicted to become high. To avoid deterioration of the battery, store the vehicle in a place where the temperature is not likely to become high". With respect to the category of cause J into which the case where the SOC is greater than the threshold value is classified, the following text message is set as the advice information, for example. "Deterioration of the battery is accelerated when the vehicle is stored with the battery being in a nearly fully charged state. Please consider to perform V2H".

The deterioration information deriving unit 13B inputs data D5D representing the derived advice information to the output unit 14, and the output unit 14 outputs the data D5D. The data D5D output from the output unit 14 is input to the display 7. Note that any of the categories of cause G, H, and J corresponds to the areas where the ΔSOH is larger than an allowable value. Therefore, the classification information of the categories of cause G, H, and J and the above pieces of advice information corresponding to the respective categories of cause each can be regarded as one of the pieces of deterioration information related to the deterioration rate of the battery 2.

Figure 17:
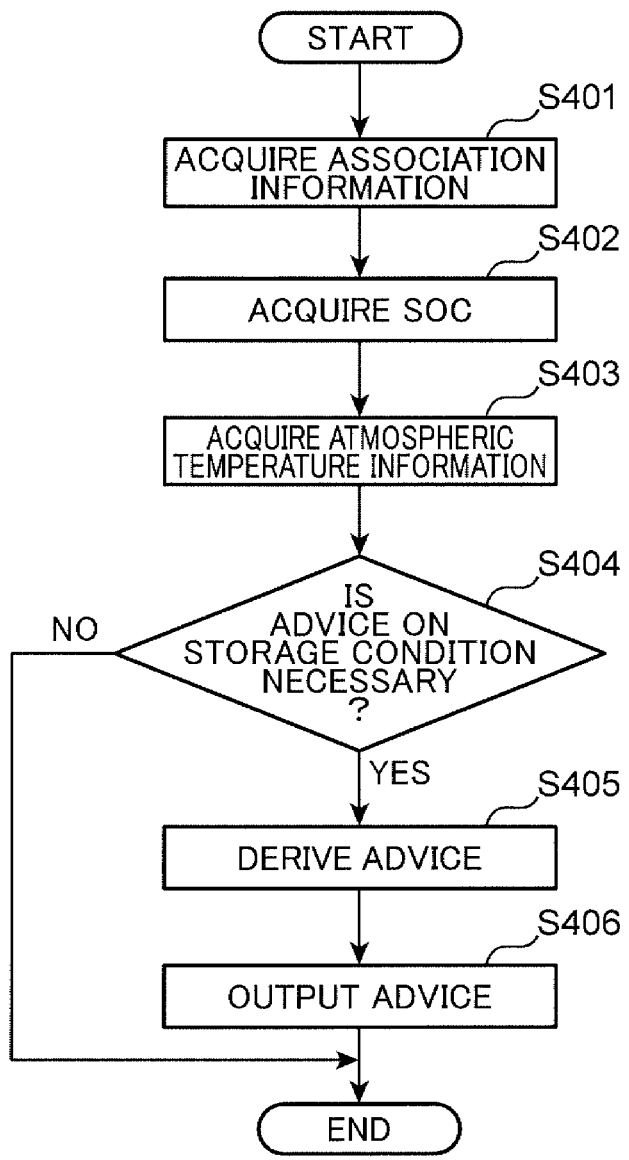
FIG. 17 is a flowchart illustrating a flow of a process performed by the information processing device.

FIG. 17 is a flowchart illustrating a flow of a process performed by the information processing device 1D. When the use of the electric vehicle is ended and the information processing device 1D is thereby activated, the process starts to be performed.

First, in step S401, the association information acquisition unit 12 acquires the association information 30D from the storage 6, and inputs the association information 30D to the deterioration information deriving unit 13D.

Next, in step S402, the SOC acquisition unit 21 acquires the information representing the SOC of the battery 2 from the battery controller 3, and inputs the information to the deterioration information deriving unit 13D.

Next, in step S403, the atmospheric temperature information acquisition unit 61 acquires the predicted highest atmospheric temperature information for the current location of the electric vehicle from the above server device via the communication unit 60, and inputs the information to the deterioration information deriving unit 13D.

Next, in step S404, by referring to the association information 30D input in step S401, the deterioration information deriving unit 13D determine if advice on the storage condition is necessary, on the basis of the SOC input in step S402 and the predicted highest atmospheric temperature input in step S403. When an output value corresponding to the SOC and the predicted highest atmospheric temperature belongs to any one of the categories of cause G, H, and J, the deterioration information deriving unit 13D determines that advice on the storage condition is necessary. On the other hand, when an output value corresponding to the SOC and the predicted highest atmospheric temperature belongs to any one of the categories of cause G, H, and J, the deterioration information deriving unit 13D determines that advice on the storage condition is necessary.

If the advice on the storage condition is not necessary (step S404: NO), the information processing device 1D ends the process.

If advice on the storage condition is necessary (step S404: YES), next, in step S405, the deterioration information deriving unit 13D derives the category of cause G, H, or J corresponding to the SOC and the predicted highest atmospheric temperature, and derives the advice information set in correspondence to the category of cause.

Next, in step S406, the output unit 14 outputs the data D5D representing the advice information derived in step S405. The data D5D output from the output unit 14 is input to the display 7. As a result, the above text message representing the preferable storage condition of the vehicle is displayed on the display 7.

The present embodiment makes it possible to present, to the user, the preferable storage condition of the vehicle in accordance with the state of the vehicle (SOC) and the predicted atmospheric temperature for the current location, and as a result, it is possible to suppress deterioration of the battery 2.

INDUSTRIAL APPLICABILITY

The technique according to the present disclosure is useful as a technique for suppressing deterioration of a battery in general electric devices driven by a secondary battery.

The invention claimed is:

1. An information processing device, comprising:
a processor; and
a memory including a program that, when executed by the processor, causes the processor to perform operations, the operations including:
  acquiring state information representing a state of a battery mounted on an electric device driven by the battery;
  acquiring association information representing an association between the state of the battery and a deterioration rate of the battery;
  deriving deterioration information related to the deterioration rate of the battery, based on the state information and the association information; and
  outputting, to a display, the deterioration information, wherein the deterioration information, which is output and displayed on the display, includes, in response to the deterioration rate of the battery being larger than a predetermined threshold value: (i) a caution message which cautions of battery deterioration; and (ii) a main cause of the deterioration rate being larger than the predetermined threshold value.

2. The information processing device according to claim 1, wherein the state of the battery includes at least one of a temperature of the battery and a current value of the battery.

3. The information processing device according to claim 2, wherein the state of the battery further includes a remaining capacity of the battery.

4. The information processing device according to claim 1, wherein the processor derives, as the deterioration information, information representing the deterioration rate of the battery.

5. The information processing device according to claim 1, wherein the processor derives, as the deterioration information, information on the main cause that causes the deterioration of the battery.

6. The information processing device according to claim 1, wherein the operations further include:
  acquiring deterioration degree information representing a deterioration degree of the battery, and
  the processor derives, as the deterioration information, a first remaining life of the battery corresponding to the deterioration rate, based on the state information, the association information, and the deterioration degree information.

7. The information processing device according to claim 6, wherein
  the processor further derives, as the deterioration information, a remaining life difference between the first remaining life and a second remaining life, and
  the second remaining life is of the battery corresponding to a previous deterioration degree under a previously set standard use condition.

8. The information processing device according to claim 1, wherein the operations further include:
  acquiring atmospheric temperature information representing a predicted atmospheric temperature at a current location, and
  the processor further derives, as the deterioration information, a preferable storage condition of the electric device, based on the state information, the association information, and the atmospheric temperature information.

9. The information processing device according to claim 1, wherein
  categories of the main cause that cause the deterioration rate of the battery to be larger than the predetermined threshold value are individually set.

10. The information processing device according to claim 9, wherein
  the association information is acquired as a three-dimensional data map related to the deterioration rate of the battery, and
  the categories of the main cause that cause the deterioration rate of the battery to be larger than the predetermined threshold value are individually set for two-dimensional data maps, with each of the two-dimensional data maps having a same two parameters as input data.

11. The information processing device according to claim 10, wherein the same two parameters are a temperature and a current value.

12. The information processing device according to claim 11, wherein the processor represents the three-dimensional data map as being constructed by the two-dimensional data maps, with each of the two-dimensional data maps having the temperature and the current value as the input data, and with the two-dimensional data maps including categories of the main cause being created at predetermined intervals of the deterioration rate.

13. The information processing device according to claim 12,
wherein, for one of the predetermined intervals, a first category of the main cause corresponds to the current value exceeding a predetermined amount, irrespective of the temperature, and
a second category and a third category of the main cause correspond to the current value being below the predetermined amount, with the second category corresponding to a first range of the temperature and the third category corresponding to a second range of the temperature, with the second range of the temperature being higher than the first range of the temperature.

14. The information processing device according to claim 13,
wherein the first range of the temperature and the second range of the temperature are discontinuous, with a third range of the temperature being between the first range of the temperature and the second range of the temperature.

15. The information processing device according to claim 1,
wherein the display displays the deterioration information, including the main cause, in response to the main cause being included in a latest target period.

16. The information processing device according to claim 1,
wherein, when a plurality of main causes cause the deterioration rate of the battery to be larger than the predetermined threshold value, the deterioration information, which is output and displayed on the display, includes the plurality of main causes.

17. A non-transitory computer-readable recording medium including a program for causing an information processing device to perform operations, the operations comprising:

acquiring state information representing a state of a battery mounted on an electric device driven by the battery;
acquiring association information representing an association between the state of the battery and a deterioration rate of the battery;
deriving deterioration information related to the deterioration rate of the battery, based on the state information and the association information; and
outputting, to a display, the deterioration information,
wherein the deterioration information, which is output and displayed on the display, includes, in response to the deterioration rate of the battery being larger than a predetermined threshold value: (i) a caution message which cautions of battery deterioration; and (ii) a main cause of the deterioration rate being larger than the predetermined threshold value.

18. An information processing method comprising, by an information processing device:
acquiring state information representing a state of a battery mounted on an electric device driven by the battery;
acquiring association information representing an association between the state of the battery and a deterioration rate of the battery;
deriving deterioration information related to the deterioration rate of the battery, based on the state information and the association information; and
outputting, to a display, the deterioration information,
wherein the deterioration information, which is output and displayed on the display, includes, in response to the deterioration rate of the battery being larger than a predetermined threshold value: (i) a caution message which cautions of battery deterioration; and (ii) a main cause of the deterioration rate being larger than the predetermined threshold value.

* * * * *